United States Patent
Feng et al.

(10) Patent No.: US 11,558,305 B2
(45) Date of Patent: Jan. 17, 2023

(54) RATE MATCHING METHOD AND APPARATUS, AND RATE DE-MATCHING METHOD AND APPARATUS

(71) Applicant: Huawei Technologies Co., Ltd., Shenzhen (CN)

(72) Inventors: Shulan Feng, Beijing (CN); Gen Li, Beijing (CN); Zukang Shen, Beijing (CN); Yi Wang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 199 days.

(21) Appl. No.: 17/028,651

(22) Filed: Sep. 22, 2020

(65) Prior Publication Data

US 2021/0014167 A1 Jan. 14, 2021

Related U.S. Application Data

(63) Continuation of application No. PCT/CN2019/082636, filed on Apr. 15, 2019.

(30) Foreign Application Priority Data

Apr. 16, 2018 (CN) .......................... 201810339728.5
Apr. 18, 2018 (CN) .......................... 201810351167.0

(51) Int. Cl.
*H04L 47/25* (2022.01)
*H04W 28/02* (2009.01)

(52) U.S. Cl.
CPC ......... *H04L 47/25* (2013.01); *H04W 28/0278* (2013.01)

(58) Field of Classification Search
CPC ........... H04W 28/0278; H03M 13/353; H03M 13/6368; H04L 1/0023; H04L 1/0067; H04L 1/0013
See application file for complete search history.

(56) References Cited

U.S. PATENT DOCUMENTS

2013/0010733 A1* 1/2013 Belaiche ............... H04L 1/0041
  370/328
2014/0187283 A1* 7/2014 Nimbalker ............ H04L 1/1822
  455/550.1
(Continued)

FOREIGN PATENT DOCUMENTS

CN  105337684 A  2/2016
CN  106416113 A  2/2017
(Continued)

OTHER PUBLICATIONS

"3rd Generation Partnership Project; Technical Specification Group Radio Access Network; NR; Physical channels and modulation (Release 15)," 3GPP TS 38.211 V15.1.0, pp. 1-90, 3rd Generation Partnership Project, Valbonne, France (Mar. 2018).

(Continued)

*Primary Examiner* — Chi H Pham
*Assistant Examiner* — Vladislav Y Agureyev
(74) *Attorney, Agent, or Firm* — Leydig, Voit & Mayer, Ltd.

(57) ABSTRACT

A rate matching method including: determining a receiving capability of a receive end, where the receiving capability is used to indicate a maximum data processing volume of the receive end in a first transmission time, and/or the receiving capability is used to indicate a maximum data buffer volume of the receive end in a first transmission time; the first transmission time is used to transmit a first transport block to which a first code block belongs; determining $N_{CB}$ based on the receiving capability, where $N_{CB}$ represents a code block size used for rate matching; performing rate matching on the first code block based on $N_{CB}$. The receive end can adjust, based on a processing capability and/or a buffer capability that are/is of the receive end in a period of time, the code block size used for rate de-matching, to avoid (Continued)

insufficiency in processing capability and/or buffer overflow at the receive end.

17 Claims, 6 Drawing Sheets

(56) References Cited

U.S. PATENT DOCUMENTS

| | | | |
|---|---|---|---|
| 2016/0056926 A1* | 2/2016 | Li | H04L 1/1896 370/280 |
| 2017/0346606 A1* | 11/2017 | Li | H04L 1/1822 |
| 2018/0035409 A1* | 2/2018 | Chmiel | H04L 1/0067 |
| 2018/0226995 A1* | 8/2018 | Wu | H03M 13/6356 |
| 2018/0270698 A1* | 9/2018 | Babaei | H04W 24/08 |
| 2019/0037586 A1* | 1/2019 | Park | H04L 1/0031 |
| 2019/0074929 A1* | 3/2019 | Aiba | H04W 72/1289 |
| 2019/0082425 A1* | 3/2019 | Li | H04W 72/042 |
| 2019/0097756 A1* | 3/2019 | Chatterjee | H04L 5/0051 |
| 2019/0132845 A1* | 5/2019 | Babaei | H04L 5/0098 |
| 2019/0149275 A1* | 5/2019 | He | H04L 1/0061 370/329 |
| 2019/0158205 A1* | 5/2019 | Sheng | H04L 5/0094 |
| 2019/0222400 A1* | 7/2019 | Bagheri | H04L 5/0082 |
| 2019/0297580 A1* | 9/2019 | Huang | H04L 1/002 |
| 2019/0312688 A1* | 10/2019 | Baldemair | H04W 52/146 |
| 2019/0313386 A1* | 10/2019 | Hwang | H04W 72/0453 |
| 2020/0099480 A1* | 3/2020 | Grövlen | H04L 1/1822 |
| 2020/0187236 A1* | 6/2020 | Moon | H04L 5/0044 |
| 2020/0229152 A1* | 7/2020 | Park | H04W 72/042 |
| 2020/0359391 A1* | 11/2020 | Baldemair | H04W 72/12 |
| 2021/0119735 A1* | 4/2021 | Xu | H04L 1/0041 |
| 2022/0173879 A1* | 6/2022 | Pelletier | H04W 52/0225 |

FOREIGN PATENT DOCUMENTS

| | | | | |
|---|---|---|---|---|
| CN | 106850169 A | 6/2017 | | |
| CN | 107852274 A | 3/2018 | | |
| EP | 2421313 A1 * | 2/2012 | | H04L 5/001 |
| EP | 3751765 A1 | 12/2020 | | |
| WO | WO-2014187371 A1 * | 11/2014 | | H04L 1/0045 |
| WO | 2015116335 A1 | 8/2015 | | |
| WO | WO-2016105173 A1 * | 6/2016 | | H04L 1/1657 |
| WO | 2016107571 A1 | 7/2016 | | |
| WO | 2016145606 A1 | 9/2016 | | |
| WO | WO-2018019498 A1 * | 2/2018 | | H04L 1/0067 |
| WO | 2018052659 A1 | 3/2018 | | |
| WO | WO-2018103556 A1 * | 6/2018 | | |

OTHER PUBLICATIONS

"3rd Generation Partnership Project; Technical Specification Group Radio Access Network; NR; Multiplexing and channel coding (Release 15)," 3GPP TS 38.212 V15.1.1, pp. 1-94, 3rd Generation Partnership Project, Valbonne, France (Apr. 2018).

"3rd Generation Partnership Project; Technical Specification Group Radio Access Network; NR; Physical layer procedures for data (Release 15)," 3GPP TS 38.214 V15.1.0, pp. 1-77, 3rd Generation Partnership Project, Valbonne, France (Mar. 2018).

"3rd Generation Partnership Project; Technical Specification Group Radio Access Network; NR; User Equipment (UE) Yadio access capabilities (Release 15)," 3GPP TS 38.306 V15.1.0, pp. 1-25, 3rd Generation Partnership Project, Valbonne, France (Mar. 2018).

"CR to 38.212 capturing the Jan18 ad-hoc and RAN1#92 meeting agreements," 3GPP TSG RAN WG1 Meeting #92, R1-1803553, Athens, Total 1 page, 3rd Generation Partnership Project, Valbonne, France (Feb. 26-Mar. 1, 2018).

"3rd Generation Partnership Project; Technical Specification Group Radio Access Network; NR; Multiplexing and channel coding (Release 15)," 3GPP TS 38.212 V15.0.1, pp. 1-91, 3rd Generation Partnership Project, Valbonne, France (Mar. 2018).

Huawei, HiSilicon, "Soft buffer management for eCA," 3GPP TSG RAN WG1 Meeting #83, Anaheim, USA, R1-156927, total 4 pages, 3rd Generation Partnership Project, Valbonne, France (Nov. 15-22, 2015).

Tao Jun et al., "An Optimal Layer Rate Dynamic Allocation Algorithm Based on Utility in Layered Multicast," Journal of Computer Research and Development, vol. 41 No. 7, total 9 pages (Jul. 2004). With English Abstract.

Panasonic, "Clarification of the limitation on the downlink rate matching repetition," TSG RAN WG1 Meeting #18, Boston, USA, TSGR1-010057, total 10 pages, 3rd Generation Partnership Project, Valbonne, France (Jan. 15-18, 2001).

* cited by examiner

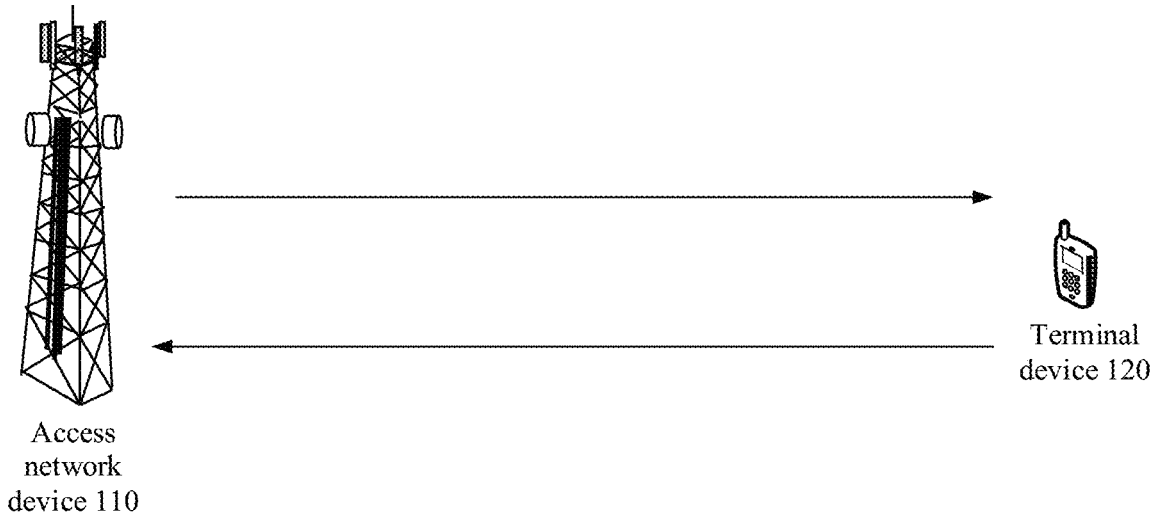

FIG. 1

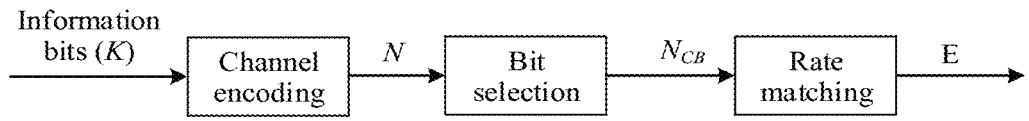

| Determine a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to transmit a first transport block to which a first code block belongs | — S310 |

| Determine $N_{CB}$ based on the receiving capability, where $N_{CB}$ represents a code block size used for rate matching | — S320 |

| Perform rate matching on the first code block based on $N_{CB}$ | — S330 |

Determine a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to receive a first transport block — S410

Determine $N_{CB}$ based on the receiving capability, where $N_{CB}$ represents a code block size used for rate de-matching — S420

Perform rate de-matching on the first transport block based on $N_{CB}$ — S430

FIG. 4

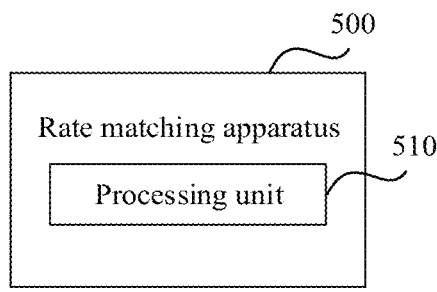

FIG. 5

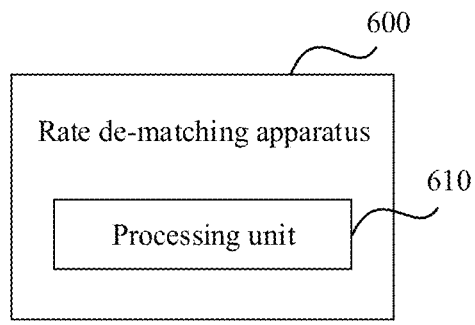

FIG. 6

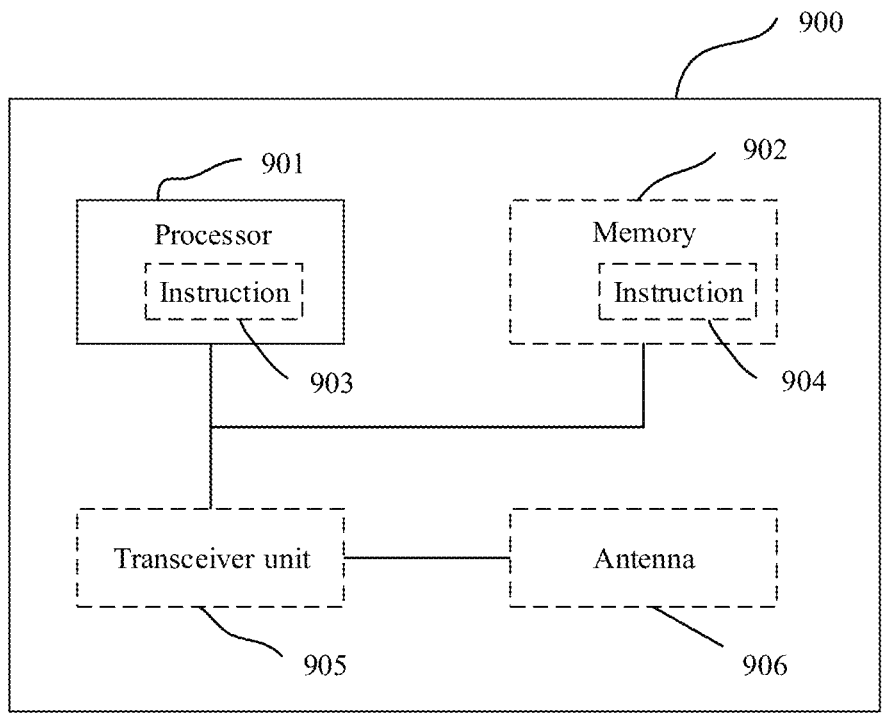

| Determine a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to transmit a first transport block to which a first code block belongs | — S1010 |

| Determine $N_{CB}$ based on the receiving capability, where $N_{CB}$ represents a code block size used for rate matching | — S1020 |

| Perform rate matching on the first code block based on $N_{CB}$ | — S1030 |

| Determine a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to receive a first transport block | — S1110 |

| Determine $N_{CB}$ based on the receiving capability, where $N_{CB}$ represents a code block size used for rate de-matching | — S1120 |

| Perform rate de-matching on the first transport block based on $N_{CB}$ | — S1130 |

FIG. 11

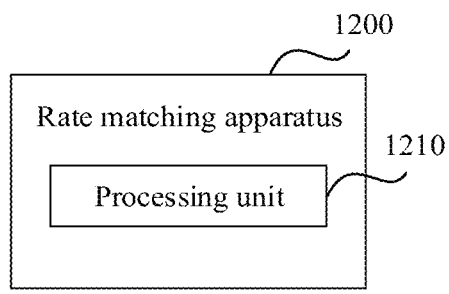

FIG. 12

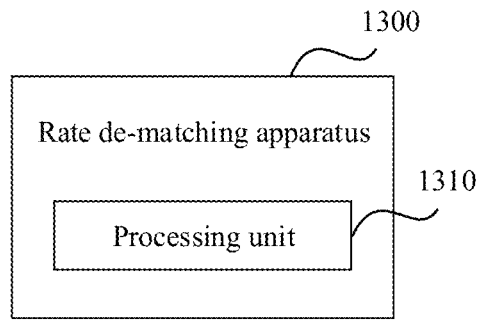

FIG. 13

RATE MATCHING METHOD AND APPARATUS, AND RATE DE-MATCHING METHOD AND APPARATUS

CROSS-REFERENCE TO RELATED APPLICATIONS

This application is a continuation of International Application No. PCT/CN2019/082636, filed on Apr. 15, 2019, which claims priority to Chinese Patent Application No. 201810351167.0, filed on Apr. 18, 2018, and Chinese Patent Application No. 201810339728.5, filed on Apr. 16, 2018. All of the aforementioned patent applications are hereby incorporated by reference in their entireties.

TECHNICAL FIELD

This application relates to the communications field, and in particular, to a rate matching method and apparatus, and a rate de-matching method and apparatus.

BACKGROUND

In a wireless communications system, channel encoding (referred to as "encoding" for short) is usually used to reduce a transmission coding rate, to improve communication reliability. Assuming that there are K information bits, decoded data has N bits, where N is greater than or equal to K. K-N bits are redundant bits. In this case, a valid coding rate is K/N. A transmit end sends a decoded N-bit code word to a receive end. After receiving the N-bit code word, the receive end uses a specific decoding scheme to correct an erroneous code word generated during transmission, and restores a correct K-bit code word.

A data block before encoding is referred to as a transport block (transport block, TB). Because the TB has a relatively large quantity of bits, the transmit end usually segments one TB into a plurality of code blocks (CB), and separately encodes the CBs. A physical resource for transmitting a code block may be inconsistent with a physical time-frequency resource for the to-be-transmitted code block. Therefore, a bit in the to-be-transmitted code block needs to be repeated or punctured, to match a bearing capability of the physical time-frequency resource. This process is referred to as rate matching. After rate matching, processing such as interleaving and concatenation needs to be performed on the plurality of encoded CBs to obtain one physical data block (code word), and the physical data block is transmitted to the receive end.

In a 5th generation (5G) mobile communications system, a first transmission time of a TB on a carrier changes with a subcarrier spacing, and a scheduling time of the TB (a time domain resource allocated to the TB) is also flexible. However, a maximum volume of data that can be processed by a receive end per unit time is fixed, and a volume of data that can be buffered by the receive end is also fixed. Therefore, in the 5G mobile communications system, a volume of data transmitted by a transmit end in a scheduling time may be beyond a processing capability and a buffer capability of the receive end in the scheduling time, resulting in insufficiency in processing capability or buffer overflow at the receive end. This reduces a receiving success rate of the receive end.

SUMMARY

This application provides a rate matching method and a computing apparatus, and a rate de-matching method and apparatus, to determine a rate matching parameter based on a processing capability and/or a buffer capability that are/is of a receive end in a scheduling time. This avoids insufficiency in processing capability and/or buffer overflow at the receive end, and improves a receiving success rate of the receive end.

According to a first aspect, a rate matching method is provided, including: determining a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to transmit a first transport block to which a first code block belongs; determining $N_{CB}$ based on the receiving capability, where $N_{CB}$ represents a code block size used for rate matching; and performing rate matching on the first code block based on $N_{CB}$.

For example, when the receiving capability of the receive end is relatively poor in the first transmission time, the receive end may select a relatively small code block size for rate de-matching, to reduce a volume of data processed and/or buffered in the first transmission time. This avoids insufficiency in processing capability and/or buffer overflow at the receive end, and improves a receiving success rate. For another example, when the receiving capability of the receive end is relatively strong in the first transmission time, the receive end may select a relatively large code block size for rate de-matching, to reduce a coding rate for a higher receiving success rate when a data volume is not beyond the receiving capability of the receive end.

Therefore, according to the rate matching method provided in this embodiment, the receive end can adjust, based on a processing capability and/or a buffer capability that are/is of the receive end in a period of time (namely, the first transmission time), a code block size used for rate de-matching. This avoids insufficiency in processing capability and/or buffer overflow at the receive end, and improves a receiving success rate of the receive end.

Optionally, the determining a receiving capability of a receive end includes:

determining the receiving capability based on $P_{max}^{(i)}$ and $S^{(i)}$, where $P_{max}^{(i)}$ represents a maximum data rate on a carrier i (also referred to as a peak rate or maximum transmission rate on the carrier), the carrier i is used to transmit the first transport block, $S^{(i)}$ represents duration of the first transmission time (referred to as first transmission duration) for the first transport block, and the receiving capability of the receive end is positively correlated with both $P_{max}^{(i)}$ and $S^{(i)}$.

$P_{max}^{(i)}$ defines a maximum volume of data that can be transmitted on the carrier i per unit time. Transmission herein includes sending and receiving. $P_{max}^{(i)}$ may also represent a maximum sending rate at a transmit end and a maximum receiving rate at the receive end. $S^{(i)}$ defines duration of data transmission. A maximum volume of data that can be processed and buffered by the receive end on the carrier i in the first transmission time may be obtained by combining $P_{max}^{(i)}$ and $S^{(i)}$. Therefore, the receiving capability of the receive end may be determined based on the maximum data rate on the carrier i and the duration of the first transmission time. For example, the receiving capability of the receive end may be represented by $P_{max}^{(i)} \cdot S^{(i)}$ or $(P_{max}^{(i)} \cdot S^{(i)})/R_{LBRM}$, where $R_{LBRM}$ represents a rate matching factor, and has max a value of a positive number less than 1. For example, $R_{LBRM}=2/3$. The maximum data buffer volume of the receive end is positively correlated with $(P_{max}^{(i)} \cdot S^{(i)})/R_{LBRM}$. The transmission time herein also includes two concepts: sending duration and receiving duration. The transmission time refers to the sending duration at the transmit end and the receiving duration at the receive end. The sending duration and the receiving duration are equal, and are not clearly distinguished in the present application.

Optionally, the determining a receiving capability of a receive end includes: determining the receiving capability of the receive end based on $TBS_{max}^{(i)}$ and $S^{(i)}$, where $TBS_{max}^{(i)}$ represents a maximum size of a transport block that can be transmitted on a carrier i in second transmission duration, $S^{(i)}$ represents duration of the transmission time (referred to as first transmission duration) for the first transport block, the carrier i is used to transmit the first transport block, the receiving capability of the receive end is positively correlated with both $TBS_{max}^{(i)}$ and $S^{(i)}$, the second transmission time is transmission duration used to determine $TBS_{max}^{(i)}$, and the receiving capability is positively correlated with a reciprocal of the second transmission time. The first transmission duration and the second transmission duration may be equal or may not be equal.

$TBS_{max}^{(i)}$ defines the maximum size of the transport block that can be transmitted on the carrier i in the second transmission time. A greater value of $TBS_{max}^{(i)}$ indicates a larger volume of data transmitted on the carrier i in a same time. When a same volume of data is transmitted, a shorter second transmission time indicates a larger volume of data processed by the receive end per unit time. Therefore, both a greater value of $TBS_{max}^{(i)}$ and a shorter second transmission time indicate a stronger receiving capability of the receive end. A peak rate of the receive end is equal to $TBS_{max}^{(i)}$ divided by the second transmission time. Therefore, the receiving capability of the receive end may be defined by $TBS_{max}^{(i)}$, $S^{(i)}$, and the second transmission time. For example, the receiving capability of the receive end is defined by $TBS_{max}^{(i)} \cdot S^{(i)}/S_2^{(i)}$, where $S_2^{(i)}$ represents the second transmission time.

Optionally, the determining $N_{CB}$ based on the receiving capability includes: determining $N_{CB,max}$ based on the receiving capability of the receive end, where $N_{CB,max}$ represents a maximum size of a single code block that can be processed by the receive end in the first transmission time, and $N_{CB,max}$ is positively correlated with the receiving capability of the receive end; and determining $N_{CB}$ based on $N_{ref}$, N, and $N_{CB,max}$, where $N_{ref}$ represents a first reference code block size, N represents a size of the first code block, and $N_{CB}$ is a smallest value among $N_{CB,max}$, $N_{ref}$, and N. $N_{ref}$ and $N_{CB,max}$ are used to indicate data buffer volumes or data processing volumes of the receive end in different cases. $N_{ref}$ represents a value obtained when the receiving capability of the receive end is not limited, while $N_{CB,max}$ represents a value obtained based on the receiving capability of the receive end in the first transmission time (the receiving capability of the receive end may be limited in the first transmission time). The transmit end uses the smallest value among $N_{ref}$, N, and $N_{CB,max}$ as the code block size ($N_{CB}$) used for rate matching, so that a volume of data actually transmitted on a channel is not beyond the processing capability and/or the buffer capability that are/is of the receive end. This can avoid insufficiency in processing capability and/or buffer overflow when the receiving capability of the receive end is limited. For example, if the receiving capability of the receive end is limited in the first transmission time, and the first transport block is excessively large, N is greater than $N_{ref}$ and $N_{ref}$ is greater than $N_{CB,max}$.

Then, the transmit end may use $N_{CB,max}$ as the code block size ($N_{CB}$) used for rate matching.

The determining $N_{CB}$ based on the receiving capability includes: determining $N_{CB,max}$ based on the receiving capability of the receive end, where $N_{CB,max}$ represents a maximum size of a single code block that can be processed by the receive end in the first transmission time, and $N_{CB,max}$ is positively correlated with the receiving capability of the receive end; and determining $N_{CB}$ based on N and $N_{CB,max}$ where N represents a size of the first code block, and $N_{CB}$ is a smaller value between $N_{CB,max}$ and N. $N_{CB,max}$ is used to indicate a data buffer volume or data processing volume of the receive end. $N_{CB,max}$ represents a value obtained based on the receiving capability of the receive end in the first transmission time (the receiving capability of the receive end may be limited in the first transmission time). The transmit end uses the smaller value between N and $N_{CB,max}$ as the code block size ($N_{CB}$) used for rate matching, so that a volume of data actually transmitted on a channel is not beyond the processing capability and/or the buffer capability that are/is of the receive end. This can avoid insufficiency in processing capability and/or buffer overflow when the receiving capability of the receive end is limited. For example, if the receiving capability of the receive end is limited in the first transmission time, and the first transport block is excessively large, N is greater than $N_{CB,max}$. Then, the transmit end may use $N_{CB,max}$ as the code block size ($N_{CB}$) used for rate matching.

Optionally, the determining $N_{CB,max}$ based on the receiving capability includes: determining $N_{CB,max}$ based on $N_{CB,max}$ and the receiving capability, where $N_{CB,max}$ is further positively correlated with $U^{(i)}$, $U^{(i)}$ represents a ratio of a transmission bandwidth of an active bandwidth part BWP of the carrier i to a sum of transmission bandwidths of active BWPs of all active receive carriers at the receive end, and the carrier i is used to transmit the first transport block.

When the receive end supports a plurality of carriers, the transmit end further needs to determine the receiving capability of the receive end on the carrier i based on a ratio of a transmission bandwidth of the carrier i to a sum of bandwidths of all activated receive carriers, where the receiving capability of the receive end on the carrier i is $U^{(i)}$ times of a total receiving capability of the receive end on a plurality of carriers. According to the foregoing optional method, insufficiency in processing capability and/or buffer overflow can be avoided at the receive end in a multi-carrier scenario.

Optionally, the determining $N_{CB}$ based on the receiving capability includes: determining $N'_{ref}$ based on $TBS_{LBRM}$, and the maximum data processing volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data processing volume, and the maximum data processing volume is positively correlated with $P_{max}^{(i)}$ and $S^{(i)}$, where $P_{max}^{(i)}$ represents the maximum data rate on the carrier i, and $S^{(i)}$ represents the duration of the first transmission time; and determining $N_{CB}$ based on N and $N'_{ref}$, where N represents a size of the first code block, and $N_{CB}$ is a smaller value between $N'_{ref}$ and N.

Optionally, the determining $N_{CB}$ based on the receiving capability includes: determining $N'_{ref}$ based on $TBS_{LBRM}$ and a maximum data transmission volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data transmission volume, the maximum data transmission volume is positively correlated with $TBS_{max}^{(i)}$ and $S^{(i)}$, and is positively correlated with a reciprocal of the second transmission duration, $TBS_{max}^{(i)}$ represents a maximum size of a transport block that can be transmitted on the carrier i in the second transmission time, $S^{(i)}$ represents the duration of the first transmission time (referred to as the first transmission duration), and the second transmission duration is duration that is of the second transmission time and that is used to determine $TBS_{max}^{(i)}$; and determining $N_{CB}$ based on N and $N'_{ref}$, where N represents a size of the first code block, and $N_{CB}$ is a smaller value between $N'_{ref}$ and N.

In this optional solution, the transmit end selects the smaller value from $TBS_{LBRM}$ and the maximum data processing volume or maximum data transmission volume on the carrier in the first transmission time, and determines the reference code block size ($N'_{ref}$) based on the smaller value. Then, the transmit end compares $N'_{ref}$ and N, and selects the smaller value from $N'_{ref}$ and N as the code block size ($N_{CB}$) used for rate matching of the first code block, so that a volume of data actually transmitted on a channel is not beyond the processing capability and/or the buffer capability that are/is of the receive end. This can avoid insufficiency in processing capability and/or buffer overflow when the receiving capability of the receive end is limited.

Optionally, the maximum data processing volume is further positively correlated with $U^{(i)}$, and $U^{(i)}$ represents a ratio of a transmission bandwidth of an active BWP of the carrier i to a sum of transmission bandwidths of active BWPs of all active receive carriers at the receive end.

When the receive end supports a plurality of carriers, the transmit end further needs to determine the receiving capability of the receive end on the carrier i based on the ratio of the transmission bandwidth of the active BWP of the carrier i to the sum of the transmission bandwidths of the active BWPs of all the active receive carriers, where the receiving capability of the receive end on the carrier i is $U^{(i)}$ times of a total receiving capability of the receive end on a plurality of carriers. According to the foregoing optional method, insufficiency in processing capability and/or buffer overflow can be avoided at the receive end in a multi-carrier scenario.

Optionally, the first transport block is a high-priority transport block and includes C code blocks, and each of the C code blocks has a size of $N_{CB}$ before rate matching, where C is a positive integer. The method further includes: determining a data buffer volume or data processing volume for the high-priority transport block based on C and $N_{CB}$, where the data buffer volume for the high-priority transport block is $N_{CB} \cdot C$; determining a remaining data buffer volume based on the maximum data buffer volume on the carrier i in the first transmission time and the data buffer volume for the high-priority transport block, where the remaining data buffer volume is equal to the maximum data buffer volume minus $N_{CB} \cdot C$, the carrier i is used to transmit the first transport block, and the remaining data buffer volume is used for low-priority data; determining $N_{CB,lp}$ based on the remaining data buffer volume, where $N_{CB,lp}$ represents a code block size used for rate matching of a code block of a low-priority transport block, $N_{CB,lp}$ is a smallest value among $N_{lp}$, $N_{ref}$, and $N_{CB,max,lp}$, $N_{lp}$ represents a size of each code block of the low-priority transport block, $N_{ref}$ represents the first reference code block size, and $N_{CB,max,lp}$ represents a maximum data volume that is determined based on the remaining data buffer volume, that can be transmitted on the carrier i, and that is of the code block used for rate matching; and performing rate matching on the code block of the low-priority transport block based on $N_{CB,lp}$.

When a plurality of TBs need to be simultaneously transmitted, the transmit end may determine a rate matching parameter of each of the TBs based on a priority of the TB. To be specific, the transmit end determines a rate matching parameter of a high-priority TB according to the foregoing method. After determining a data buffer volume for the high-priority TB, the transmit end determines, based on a current remaining buffer resource or data processing resource, a size ($N_{CB,max,lp}$) of a code block that is of a low-priority TB and that can be transmitted on the carrier i; compares $N_{CB,max,lp}$, $N_{lp}$, and $N_{ref}$; and selects a smallest value from $N_{CB,max,lp}$, $N_{lp}$, and $N_{ref}$ as a code block size ($N_{CB,lp}$) used for rate matching of the code block of the low-priority TB, so that a volume of data actually transmitted on a channel is not beyond the processing capability and/or the buffer capability that are/is of the receive end. This can avoid insufficiency in processing capability and/or buffer overflow during reception of a low-priority TB when the receiving capability of the receive end is limited.

Optionally, the method further includes: receiving a notification message from the receive end, where the notification message is used to indicate that a size of data received by the receive end is beyond the receiving capability of the receive end; and reducing, based on the notification message, a size of data to be sent per unit time.

In the foregoing solution, a volume of data transmitted on a channel can be reduced in time, so that the volume of data actually transmitted on the channel is not beyond the processing capability and/or the buffering capability that are/is of the receive end.

Optionally, the notification message further includes a recommended transmission rate, and the recommended transmission rate is a data transmission rate that matches the receiving capability of the receive end.

The recommended transmission rate is a data transmission rate determined by the receive end based on the receiving capability in the current first transmission time. The transmit end determines, based on the recommended transmission rate, a code block size used for rate matching, so that the volume of data actually transmitted on the channel is not beyond the processing capability and/or the buffer capability that are/is of the receive end.

Optionally, the notification message is physical layer signaling, higher layer signaling, or media access control (MAC) layer signaling.

According to a second aspect, a rate de-matching method is provided, including: determining a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to receive a first transport block; determining $N_{CB}$ based on the receiving capability, where $N_{CB}$ represents a code block size used for rate de-matching; and performing rate de-matching on the first transport block based on $N_{CB}$. The transmission time may also be considered as a receiving time at the receive end.

For example, when the receiving capability of the receive end is relatively poor in the first transmission time, the receive end may select a relatively small code block size for rate de-matching, to reduce a volume of data processed and/or buffered in the first transmission time. This avoids insufficiency in processing capability and/or buffer overflow at the receive end, and improves a receiving success rate. For another example, when the receiving capability of the receive end is relatively strong in the first transmission time, the receive end may select a relatively large code block size for rate de-matching, to reduce a coding rate for a higher receiving success rate when a data volume is not beyond the receiving capability of the receive end.

Therefore, according to the rate matching method provided in this embodiment, the receive end can adjust, based on a processing capability and/or a buffer capability that are/is of the receive end in a period of time (namely, the first transmission time), the code block size used for rate de-matching. This avoids insufficiency in processing capability and/or buffer overflow at the receive end, and improves a receiving success rate of the receive end.

Optionally, the determining a receiving capability of a receive end includes: determining the receiving capability based on $P_{max}^{(i)}$ and $S^{(i)}$, where P represents a maximum data rate on a carrier i, the carrier i is used to transmit the first transport block, $S^{(i)}$ represents duration of the first transmission time (referred to as first transmission duration) for the first transport block, and the receiving capability of the receive end is positively correlated with both $P_{max}^{(i)}$ and $S^{(i)}$.

$P^{(i)}$ defines a maximum volume of data that can be processed on the carrier i per max unit time. $S^{(i)}$ defines duration of data transmission. A maximum volume of data that can be processed and buffered by the receive end on the carrier i in the first transmission time may be obtained by combining $P_{max}^{(i)}$ and $S^{(i)}$. Therefore, the receiving capability of the receive end max may be determined based on the maximum data rate on the carrier i and the duration of the first transmission time. For example, the receiving capability of the receive end may be represented by $P_{max}^{(i)} \cdot S^{(i)}$ or $P_{max}^{(i)} \cdot S^{(i)} / R_{LBRM}$.

Optionally, the determining a receiving capability of a receive end includes:

determining the receiving capability of the receive end based on $TBS_{max}^{(i)}$ and $S^{(i)}$, where $TBS_{max}^{(i)}$ represents a maximum size of a transport block that can be transmitted on a carrier i in second transmission duration, $S^{(i)}$ represents duration of the transmission time (referred to as first transmission duration) for the first transport block, the carrier i is used to transmit the first transport block, the receiving capability of the receive end is positively correlated with both $TBS_{max}^{(i)}$ and $S^{(i)}$, the second transmission time is transmission duration used to determine $TBS_{max}^{(i)}$, and the receiving capability is positively correlated with a reciprocal of the second transmission time. The first transmission duration and the second transmission duration may be equal or may not be equal.

$TBS_{max}^{(i)}$ defines the maximum size of the transport block that can be transmitted on the carrier i in the second transmission time. A greater value of $TBS_{max}^{(i)}$ indicates a larger volume of data transmitted on the carrier i in a same time. When a same volume of data is transmitted, a shorter second transmission time indicates a larger volume of data processed by the receive end per unit time. Therefore, a greater value of $TBS_{max}^{(i)}$ indicates a stronger receiving capability of the receive end. A peak rate of the receive end is equal to $TBS_{max}^{(i)}$ divided by the second transmission time. Therefore, the receiving capability of the receive end may be defined by $TBS_{max}^{(i)}$, $S^{(i)}$, and the second transmission time. For example, the receiving capability of the receive end may be defined by $TBS_{max}^{(i)} \cdot S^{(i)} / S_2^{(i)}$, where $S_2^{(i)}$ represents the second transmission time. Alternatively, the receiving capability may be represented by $[TBS_{max}^{(i)} \cdot S^{(i)} / S_2^{(i)}] / R_{LBRM}$.

Optionally, the determining $N_{CB}$ based on the receiving capability includes: determining $N_{CB,max}$ based on the receiving capability of the receive end, where $N_{CB}$ represents a maximum size of a single code block that can be processed by the receive end in the first transmission time, and $N_{CB,max}$ is positively correlated with the receiving capability of the receive end; and determining $N_{CB}$ based on $N_{ref}$, N, and $N_{CB,max}$ where $N_{ref}$ represents a first reference code block size, N represents a size of a first code block, and $N_{CB}$ is a smallest value among $N_{CB,max}$, $N_{ref}$ and N.

$N_{ref}$ and $N_{CB,max}$ are used to indicate data buffer volumes of the receive end in different cases. $N_{ref}$ represents a value obtained when the receiving capability of the receive end is not limited, while $N_{CB,max}$ represents a value obtained based on the receiving capability of the receive end in the first transmission time (the receiving capability of the receive end may be limited in the first transmission time). The receive end uses the smallest value among $N_{ref}$, N, and $N_{CB,max}$ as the code block size ($N_{CB}$) used for rate de-matching, so that a volume of data actually processed and buffered in the first transmission time is not beyond the receiving capability of the receive end. This can avoid insufficiency in processing capability and/or buffer overflow when the receiving capability of the receive end is limited. For example, if the receiving capability of the receive end is limited in the first transmission time, and the first transport block is excessively large, N is greater than $N_{ref}$ and $N_{ref}$ is greater than $N_{CB,max}$. Then, the receive end may use $N_{CB,max}$ as the code block size ($N_{CB}$) used for rate de-matching.

Optionally, the determining $N_{CB}$ based on the receiving capability includes: determining $N_{CB,max}$ based on the receiving capability of the receive end, where $N_{CB,max}$ represents a maximum size of a single code block that can be processed by the receive end in the first transmission time, and $N_{CB,max}$ is positively correlated with the receiving capability of the receive end; and determining $N_{CB}$ based on N and $N_{CB,max}$, where N represents a size of a first code block, and $N_{CB}$ is a smaller value between $N_{CB,max}$ and N. $N_{CB,max}$ is used to indicate a data buffer volume of the receive end. $N_{CB,max}$ represents a value obtained based on the receiving capability of the receive end in the first transmission time (the receiving capability of the receive end may be limited in the first transmission time). The receive end uses the smaller value between N and $N_{CB,max}$ as the code block size ($N_{CB}$) used for rate de-matching, so that a volume of data actually processed and buffered in the first transmission time is not beyond the receiving capability of the receive end. This can avoid insufficiency in processing capability and/or buffer overflow when the receiving capability of the receive end is limited. For example, if the receiving capability of the receive end is limited in the first transmission time, and the first transport block is excessively large, N is greater than $N_{CB,max}$. Then, the receive end may use $N_{CB,max}$ as the code block size ($N_{CB}$) used for rate de-matching.

Optionally, the determining $N_{CB,max}$ based on the receiving capability includes: determining $N_{CB,max}$ based on $U^{(i)}$ and the receiving capability, where $N_{CB,max}$ is further positively correlated with $U^{(i)}$, $U^{(i)}$ represents a ratio of a transmission bandwidth of an active BWP of the carrier i to a sum of transmission bandwidths of active BWPs of all active receive carriers at the receive end, and the carrier i is used to transmit the first transport block.

When the receive end supports a plurality of carriers, the receive end further needs to determine the receiving capability of the receive end on the carrier i based on a ratio of a transmission bandwidth of the carrier i to a sum of bandwidths of all activated receive carriers, where the receiving capability of the receive end on the carrier i is $U^{(i)}$ times of a total receiving capability of the receive end on a plurality of carriers. According to the foregoing optional method, insufficiency in processing capability and/or buffer overflow can be avoided at the receive end in a multi-carrier scenario.

Optionally, the determining $N_{CB}$ based on the receiving capability includes: determining $N'_{ref}$ based on $TBS_{LBRM}$ and the maximum data processing volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data processing volume, and the maximum data processing volume is positively correlated with $P_{max}^{(i)}$ and $S^{(i)}$, where $P_{max}^{(i)}$ represents the maximum data rate on the carrier i, and $S^{(i)}$ represents the duration of the transmission time; and determining $N_{CB}$ based on N and $N'_{ref}$, where N represents a size of a first code block, and $N_{CB}$ is a smaller value between $N'_{ref}$ and N.

Optionally, the determining $N_{CB}$ based on the receiving capability includes: determining $N'_{ref}$ based on $TBS_{LBRM}$ and a maximum data transmission volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data transmission volume, the maximum data transmission volume is positively correlated with $TBS_{max}^{(i)}$ and $S^{(i)}$, and is positively correlated with a reciprocal of the second transmission duration, $TBS_{max}^{(i)}$ represents a maximum size of a transport block that can be transmitted on the carrier i in the second transmission time, $S^{(i)}$ represents duration for transmitting the first transport block (referred to as the first transmission time), and the second transmission time is transmission duration used to determine $TBS_{max}^{(i)}$; and determining $N_{CB}$ based on N and $N'_{ref}$, where N represents a size of a first code block, and $N_{CB}$ is a smaller value between $N'_{ref}$ and N.

Optionally, the determining $N_{CB}$ based on the receiving capability includes: determining $N'_{ref}$ based on $TBS_{LBRM}$ and a maximum data transmission volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data transmission volume, the maximum data transmission volume is positively correlated with $TBS_{max}^{(i)}$ and $S^{(i)}$, and is positively correlated with a reciprocal of the second transmission duration, $TBS_{max}^{(i)}$ represents a maximum size of a transport block that can be transmitted on the carrier i in the second transmission time, $S^{(i)}$ represents the duration of the first transmission time (referred to as the first transmission duration), and the second transmission duration is duration that is of the second transmission time and that is used to determine $TBS_{max}^{(i)}$; and determining $N_{CB}$ based on N and $N'_{ref}$, where N represents a size of a first code block, and $N_{CB}$ is a smaller value between $N'_{ref}$ and N.

In this optional solution, the receive end selects the smaller value from $TBS_{LBRM}$ and the maximum data transmission volume on the carrier i in the first transmission time, and determines the reference code block size ($N'_{ref}$) based on the smaller value. Then, the receive end compares $N'_{ref}$ and N, and selects the smaller value from $N'_{ref}$ and N as the code block size ($N_{CB}$) used for rate de-matching of the first code block, so that a volume of data actually processed by the receive end in the first transmission time is not beyond the receiving capability of the receive end. This can avoid insufficiency in processing capability and/or buffer overflow when the receiving capability of the receive end is limited.

Optionally, the maximum data transmission volume is further positively correlated with $U^{(i)}$, and $U^{(i)}$ represents a ratio of a transmission bandwidth of an active BWP of the carrier i to a sum of transmission bandwidths of active BWPs of all active receive carriers at the receive end.

When the receive end supports a plurality of carriers, the receive end further needs to determine the receiving capability of the receive end on the carrier i based on a ratio of a transmission bandwidth of the carrier i to a sum of bandwidths of all activated receive carriers, where the receiving capability of the receive end on the carrier i is $U^{(i)}$ times of a total receiving capability of the receive end on a plurality of carriers. According to the foregoing optional method, insufficiency in processing capability and/or buffer overflow can be avoided at the receive end in a multi-carrier scenario.

Optionally, the first transport block is a high-priority transport block and includes C code blocks, and each of the C code blocks has a size of $N_{CB}$ before rate de-matching, where C is a positive integer. The method further includes: determining a data buffer volume for the high-priority transport block based on C and $N_{CB}$, where the data buffer volume for the high-priority transport block is $N_{CB} \cdot C$; determining a remaining data buffer volume based on the maximum data buffer volume on the carrier i in the first transmission time and the data buffer volume for the high-priority transport block, where the remaining data buffer volume is equal to the maximum data buffer volume minus $N_{CB} \cdot C$, the carrier i is used to transmit the first transport block, and the remaining data buffer volume is used for low-priority data; determining $N_{CB,lp}$ based on the remaining data buffer volume, where $N_{CB,lp}$ represents a code block size used for rate de-matching of a code block of a low-priority transport block, $N_{CB,lp}$ is a smallest value among $N_{lp}$, $N_{ref}$, and $N_{CB,max,lp}$, $N_{lp}$ represents a size of each code block of the low-priority transport block, $N_{ref}$ represents the first reference code block size, and $N_{CB,max,lp}$ represents a maximum data volume that is determined based on the remaining data buffer volume, that can be transmitted on the carrier i, and that is of the code block used for rate de-matching; and performing rate de-matching on the code block of the low-priority transport block based on $N_{CB,lp}$.

When a plurality of TBs need to be simultaneously transmitted, the receive end may determine, based on a priority of each of the TBs, a code block size used for rate de-matching of the TB. To be specific, the receive end determines a code block size used for rate de-matching of a high-priority TB according to the foregoing method. After determining a data buffer volume required for rate de-matching of the high-priority TB, the receive end determines, based on a current remaining data buffer volume, a size ($N_{CB,max,lp}$) of a code block that is of a low-priority TB and that can be transmitted on the carrier i; compares $N_{CB,max,lp}$, $N_{lp}$, and $N_{ref}$; and selects a smallest value from $N_{CB,max,lp}$, $N_{lp}$, and $N_{ref}$ as a code block size ($N_{CB,lp}$) used for rate de-matching of the code block of the low-priority TB, so that a volume of data actually processed by the receive end in the first transmission time is not beyond the receiving capability of the receive end. This can avoid insufficiency in processing capability and/or buffer overflow during reception of a low-priority TB when the receiving capability of the receive end is limited.

Optionally, the method further includes: sending a notification message to a transmit end, where the notification message is used to indicate that a size of data received by the receive end is beyond the receiving capability of the receive end.

In the foregoing solution, a volume of data transmitted on a channel can be reduced in time, so that the volume of data actually transmitted on the channel is not beyond the processing capability and/or the buffering capability that are/is of the receive end.

Optionally, the notification message further includes a recommended transmission rate, and the recommended transmission rate is a data transmission rate that matches the receiving capability of the receive end.

The recommended transmission rate is a data transmission rate determined by the receive end based on the receiving capability in the current first transmission time. The transmit end determines, based on the recommended transmission rate, a code block size used for rate matching, so that the volume of data actually transmitted on the channel is not beyond the processing capability and/or the buffer capability that are/is of the receive end.

Optionally, the notification message is physical layer signaling, higher layer signaling, or MAC layer signaling.

According to a third aspect, a rate matching apparatus is provided. The apparatus may be a communications device (for example, a terminal device or a network device), or may be a chip in a communications device. The apparatus may include a processing unit and a transceiver unit. When the apparatus is the communications device, the processing unit may be a processor, and the transceiver unit may be a transceiver. The communications device may further include a storage unit, and the storage unit may be a memory. The storage unit is configured to store an instruction, and the processing unit executes the instruction stored in the storage unit, to enable the communications device to perform the method according to any one of the first aspect and the optional implementations of the first aspect. When the apparatus is the chip in the communications device, the processing unit may be a processor, and the transceiver unit may be an input/output interface, a pin, a circuit, or the like. The processing unit executes an instruction stored in a storage unit, to enable the communications device to perform the method according to any one of the first aspect and the optional implementations of the first aspect. The storage unit may be a storage unit in the chip (such as a register or a cache) or a storage unit in the communications device and outside the chip (such as a read-only memory or a random access memory).

According to a fourth aspect, a rate de-matching apparatus is provided. The apparatus may be a communications device (for example, a terminal device or a network device), or may be a chip in a communications device. The apparatus may include a processing unit and a transceiver unit. When the apparatus is the communications device, the processing unit may be a processor, and the transceiver unit may be a transceiver. The communications device may further include a storage unit, and the storage unit may be a memory. The storage unit is configured to store an instruction, and the processing unit executes the instruction stored in the storage unit, to enable the communications device to perform the method according to any one of the first aspect and the optional implementations of the first aspect. When the apparatus is the chip in the communications device, the processing unit may be a processor, and the transceiver unit may be an input/output interface, a pin, a circuit, or the like. The processing unit executes an instruction stored in a storage unit, to enable the communications device to perform the method according to any one of the first aspect and the optional implementations of the first aspect. The storage unit may be a storage unit in the chip (such as a register or a cache) or a storage unit in the communications device and outside the chip (such as a read-only memory or a random access memory).

According to a fifth aspect, a network system is provided, where the network system includes the rate matching apparatus according to the third aspect and the rate de-matching apparatus according to the fourth aspect.

According to a sixth aspect, a computer program product is provided, where the computer program product includes computer program code, and when the computer program code is run by a communications unit and a processing unit of a transmit end or a transceiver and a processor of a transmit end, the transmit end is enabled to perform the method according to the first aspect.

According to a seventh aspect, a computer program product is provided, where the computer program product includes computer program code, and when the computer program code is run by a communications unit and a processing unit of a receive end or a transceiver and a processor of a receive end, the receive end is enabled to perform the method according to the second aspect.

According to an eighth aspect, a non-transitory computer-readable storage medium storing computer instructions, that when executed by one or more processors, cause the one or more processors to enable the first aspect.

According to a ninth aspect, a non-transitory computer-readable storage medium storing computer instructions, that when executed by one or more processors, cause the one or more processors to enable the second aspect.

According to a tenth aspect, a chip is provided, where the chip stores an instruction, and when the instruction is run on a transmit end, the chip is enabled to perform the method according to the first aspect.

According to an eleventh aspect, a chip is provided, where the chip stores an instruction, and when the instruction is run on a receive end, the chip is enabled to perform the method according to the second aspect.

BRIEF DESCRIPTION OF DRAWINGS

FIG. 1 shows a communications system to which this application is applicable;

FIG. 2 is a schematic diagram of a communication method to which this application is applicable;

FIG. 3 is a schematic diagram of a rate matching method according to an embodiment of this application;

FIG. 4 is a schematic diagram of a rate de-matching method according to an embodiment of this application;

FIG. 5 is a schematic diagram of a rate matching apparatus according to an embodiment of this application;

FIG. 6 is a schematic diagram of a rate de-matching apparatus according to an embodiment of this application;

FIG. 9 is a schematic diagram of a communications apparatus for rate matching and/or rate de-matching according to an embodiment of this application;

FIG. 10 is a schematic diagram of another rate matching method according to an embodiment of this application;

FIG. 11 is a schematic diagram of another rate dematching method according to an embodiment of this application;

FIG. 12 is a schematic diagram of another rate matching apparatus according to an embodiment of this application; and FIG. 13 is a schematic diagram of another rate dematching apparatus according to an embodiment of this application.

DESCRIPTION OF EMBODIMENTS

Figure 7:
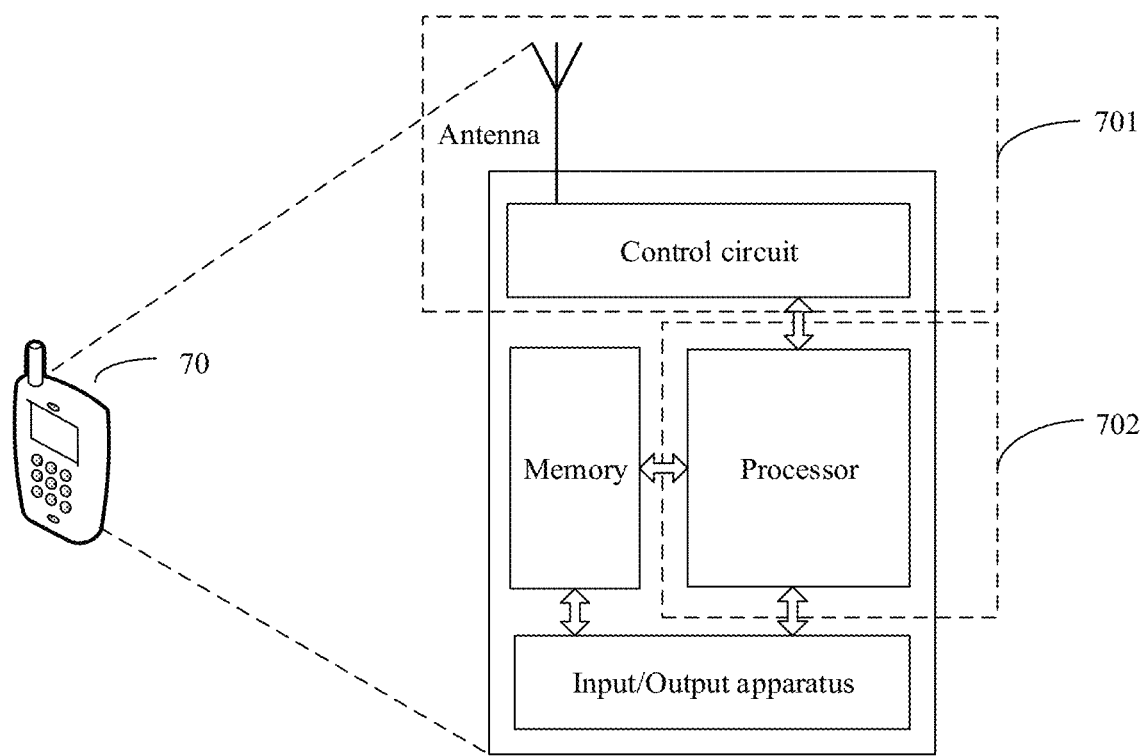
FIG. 7 is a schematic diagram of a terminal device according to an embodiment of this application.

The following describes the technical solutions of this application with reference to the accompanying drawings.

FIG. 1 shows a communications system 100 to which this application is applicable. The communications system 100 includes an access network device 110 and a terminal device 120. The access network device 110 communicates with the terminal device 120 through a wireless network. When the terminal device 120 sends data, a wireless communications module may encode information for transmission. Specifically, the wireless communications module may obtain a specific quantity of information bits to be sent to the access network device 110 through a channel. The information bits are, for example, information bits generated by a processing module, received from another device, or stored in a storage module. The information bits may be included in one or more TBs, and the TB may be segmented to generate a plurality of CBs.

When uplink transmission is performed in the communications system 100, the terminal device 120 is a transmit end, and the access network device 110 is a receive end. When downlink transmission is performed in the communications system 100, the access network device 110 is a transmit end, and the terminal device 120 is a receive end.

The technical solutions provided in the embodiments of this application may be applied to various communications systems, for example, 5G mobile communications systems. The 5G mobile communications systems described in this application include a non-standalone (NSA) 5G mobile communications system and/or a standalone (SA) 5G mobile communications system. The technical solutions provided in the embodiments of this application may be further applied to a future communications system, for example, a 6th generation mobile communications system.

In this application, the terminal device may be referred to as an access terminal, user equipment (UE), a subscriber unit, a subscriber station, a mobile station, a mobile station, a remote station, a remote terminal, a mobile device, a user terminal, a terminal, a wireless communications device, a user agent, or a user apparatus. The access terminal may be a cellular phone, a handheld device having a wireless communication function, a computing device or another processing device connected to a wireless modem, a vehicle-mounted device, a wearable device, and user equipment in a 5G communications system.

The access network device may be a base transceiver station (base transceiver station, BTS) in a code division multiple access (code division multiple access, CDMA) system, a NodeB (NB) in a wideband code division multiple access (WCDMA) system, an evolved NodeB (eNB) in a long term evolution (LTE) system, or a gNodeB (gNB) in a 5G communications system. The foregoing base stations are merely examples for description. The access network device may alternatively be a relay station, an access point, a vehicle-mounted device, a wearable device, or another type of device.

The communications system to which this application is applicable is merely an example for description, and a communications system to which this application is applicable is not limited thereto. For example, the communications system may include another quantity of access network devices and another quantity of terminal devices.

To facilitate understanding of this application, before rate matching methods provided in the embodiments of this application are described, concepts in this application are first briefly described.

To achieve a better decoding effect, if decoding fails, a receive end may store soft information of received data, and storage of the soft information may consume a storage resource of the receive end. Assuming that each encoded code block has N bits, the receive end needs to store N·L bits, where L represents a quantity of valid bits of soft information of each received data. When a buffer of the receive end is limited, a transmit end may perform rate matching on the code block using a limited buffer rate matching (limited buffer rate matching, LBRM) technology, to reduce a buffer volume at the receive end. As shown in FIG. 2, after encoding K information bits, the transmit end obtains an N-bit code block. If a quantity N of bits of the code block is less than or equal to $N_{ref}$ ($N_{ref}$ represents a reference code block size), the transmit end may perform rate matching based on an actual code block size; or if N is greater than $N_{ref}$, the transmit end may perform rate matching on the encoded code block based on $N_{ref}$. A code block size $N_{CB}$ used by the transmit end for rate matching is a smaller value between $N_{ref}$ and N, that is, $N_{CB}=\min(N,N_{ref})$. The foregoing process of determining $N_{CB}$ is bit selection.

For example, the encoded code block has 100 bits, and $N_{ref}$ is equal to 90 bits. Then, $N_{CB}$ is equal to 90 bits. In other words, first 90 bits in the 100 bits are selected for rate matching, and last 10 bits are discarded, to reduce a volume of data to be stored at the receive end. Because a redundant bit is added to the information bits during encoding, the receive end may decode the information bits based on the redundant bit. Therefore, when there are few bits discarded, and a channel condition is relatively good, the bit selection does not cause a decoding failure at the receive end.

The following describes in detail the rate matching methods provided in the embodiments of this application.

FIG. 3 is a schematic diagram of a rate matching method according to an embodiment of this application. The method 300 shown in FIG. 3 is performed by a transmit end, and the method 300 includes the following steps.

S310: Determine a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to transmit a first transport block to which a first code block belongs.

The receiving capability may refer to a maximum volume of data processed by the receive end per unit time. The transmit end may calculate the maximum data processing volume of the receive end in the first transmission time based on the maximum volume of data processed by the receive end per unit time. The receiving capability may alternatively refer to a maximum size of a transport block that can be received by the receive end in the first transmission time, or may refer to another parameter used to indicate the maximum data processing volume of the receive end in the first transmission time. Similarly, the receiving capability may alternatively refer to any parameter used to indicate the maximum data buffer size of the receive end in the first transmission time. This is not limited in this application.

In a rate matching process, the first code block is a code block on which channel encoding has been performed and bit selection has not been performed.

S320: Determine $N_{CB}$ based on the receiving capability, where $N_{CB}$ represents a code block size used for rate matching.

$N_{CB}$ represents a code block size that matches the receiving capability of the receive end. For example, the receive end can receive a maximum of X bits of data in the first transmission time. Then, $N_{CB}$ is less than or equal to a value obtained by dividing X by Y, where Y represents a quantity of code blocks into which the first transport block is segmented.

S330: Perform rate matching on the first code block based on $N_{CB}$.

For example, the transmit end may select, based on a scheduled time-frequency resource and a modulation and coding scheme (modulation and coding scheme, MCS) table, a modulation and coding parameter corresponding to $N_{CB}$, to perform rate matching on the first code block. For a specific rate matching method, refer to a rate matching method in the prior art. For brevity, details are not described herein.

According to the method provided in this embodiment, when the receiving capability of the receive end is relatively poor in the first transmission time, the transmit end may select a relatively small code block size for rate matching, to increase a coding rate and reduce a volume of data transmitted in the first transmission time. This avoids insufficiency in processing capability and/or buffer overflow at the receive end, and improves a receiving success rate. Alternatively, when the receiving capability of the receive end is relatively strong in the first transmission time, the transmit end may select a relatively large code block size for rate matching, to reduce a coding rate for a higher receiving success rate when a data volume is not beyond the receiving capability of the receive end.

Therefore, according to the rate matching method provided in this embodiment, the transmit end can adjust, based on a processing capability and/or a buffer capability that are/is of the receive end in a period of time (namely, the first transmission time), a code block size used for rate matching. This avoids insufficiency in processing capability and/or buffer overflow at the receive end, and improves a receiving success rate of the receive end.

Optionally, S310 includes:
determining the receiving capability based on $P_{max}^{(i)}$ and $S^{(i)}$, where $P_{max}^{(i)}$ represents a maximum data rate (also referred to as a peak rate or a maximum transmission rate) on a carrier i, the carrier i is used to transmit the first transport block, $S^{(i)}$ represents duration of the first transmission time (referred to as first transmission duration) for the first transport block, and the receiving capability of the receive end is positively correlated with both $P_{max}^{(i)}$ and $S^{(i)}$.

$P_{max}^{(i)}$ defines a maximum volume of data that can be processed on the carrier i per unit time. $S^{(i)}$ defines duration of data transmission. A maximum volume of data that can be processed and buffered by the receive end on the carrier i in the first transmission time may be obtained by combining $P_{max}^{(i)}$ and $S^{(i)}$. Therefore, the receiving capability of the receive end may be determined based on the maximum data rate on the carrier i and the duration of the first transmission time. For example, the receiving capability of the receive end is represented by $P_{max}^{(i)} \cdot S^{(i)}$. For a method for calculating $P_{max}^{(i)}$ and a method for calculating $S^{(i)}$, refer to max calculation methods in another embodiment below. For another example, the receiving capability of the receive end is represented by $P_{max}^{(i)} \cdot S^{(i)} / R_{LBRM}$.

In this application, that O is positively correlated with M means that when M increases, O also increases, but a manner in which M increases and a manner in which O increases are not limited. For example, when M linearly increases, O may linearly or nonlinearly increase.

That O is positively correlated with M may alternatively mean that when M decreases, O also decreases, but a manner in which M decreases and a manner in which O decreases are not limited. For example, when M linearly decreases, O may linearly or nonlinearly decrease.

M and O may represent any two physical parameters. For example, O represents the receiving capability of the receive end, and M is $P_{max}^{(i)}$ or $S^{(i)}$. The foregoing description about the positive correlation is also applicable to positive correlation in other parts of this application.

Optionally, S310 includes:
determining the receiving capability of the receive end based on $TBS_{max}^{(i)}$ and $S^{(i)}$, where $TBS_{max}^{(i)}$ represents a maximum size of a transport block that can be transmitted on a carrier i in second transmission time, $S^{(i)}$ represents duration of the first transmission time (referred to as first transmission duration), the carrier i is used to transmit the first transport block, the receiving capability of the receive end is positively correlated with both $TBS_{max}^{(i)}$ and $S^{(i)}$, the second transmission time is used to determine $TBS_{max}^{(i)}$, and the receiving capability of the receive end is negatively correlated with the second transmission time.

In this application, that E is negatively correlated with F means that when E increases, F decreases, and a specific manner in which F decreases with the increase of E is not limited. For example, when E linearly increases, F may linearly or nonlinearly decrease.

That E is negatively correlated with F alternatively means that when E decreases, F increases, and a specific manner in which F increases with the decrease of E is not limited. For example, when E linearly decreases, F may linearly or nonlinearly increase.

E and F may represent any two physical parameters. For example, E represents the receiving capability of the receive end, and F represents the second transmission time. The foregoing description about the negative correlation is also applicable to negative correlation in other parts of this application.

$TBS_{max}^{(i)}$ defines the maximum size of the transport block that can be transmitted on the carrier i in the second transmission time. A greater value of $TBS_{max}^{(i)}$ indicates a larger volume of data transmitted on the carrier i in a same transmission time, or indicates a shorter second transmission time when a same volume of data is transmitted on the carrier i. A greater value of $TBS_{max}^{(i)}$ also indicates a larger volume of data processed by the receive end per unit time. Therefore, a greater value of $TBS_{max}^{(i)}$ indicates a stronger receiving capability of the receive end. A peak processing rate of the receive end is equal to $TBS_{max}^{(i)}$ divided by the second transmission time. Therefore, the receiving capability of the receive end may be defined by $TBS_{max}^{(i)}$, $S^{(i)}$, and the second transmission time. For example, the receiving capability of the receive end is represented by $TBS_{max}^{(i)} \cdot S^{(i)} / S_2^{(i)}$, where $S_2^{(i)}$ represents the second transmission time. For example, the receiving capability of the receive end is represented by $[TBS_{max}^{(i)} \cdot S^{(i)} / S_2^{(i)}] / R_{LBRM}$. $TBS_{max}^{(i)}$ may be calculated based on a maximum quantity of multiple-input multiple-output (MIMO) layers, a maximum modulation order, and a maximum coding rate that are supported by the receive end, and $TBS_{max}^{(i)}$ is calculated according to a method described in section 5.1.3.2 of a communications standard (3GPP TS 38.214 V F.1.0) and by using a maximum bandwidth of the carrier i as a maximum configured BWP and a minimum subcarrier spacing supported by the carrier i as a subcarrier spacing. The second transmission time is a slot length corresponding to the minimum subcarrier spacing supported by the carrier i. For example, if the subcarrier spacing is 30 kHz, duration of the second transmission time is 0.5 ms. $TBS_{max}^{(i)}$ may further be obtained based on a maximum data rate $P_{max}^{(i)}$ of the receive end on the carrier i. For example, $TBS_{max}^{(i)} = TBS_{max}^{(i)} \cdot S_2^{(i)}$. $TBS_{max}^{(i)}$ may further be obtained based on a device type of the receive end. For example, if the device type of the receive end is LTE UE Category (Category) 6, $TBS_{max}^{(i)} = 149776$ bits, and $S_2^{(i)} = 1$ millisecond.

Optionally, S320 includes:

determining $N_{CB,max}$ based on the receiving capability of the receive end, where $N_{CB,max}$ represents a maximum size of a single code block that can be processed by the receive end in the first transmission time, and $N_{CB,max}$ is positively correlated with the receiving capability of the receive end; and determining $N_{CB}$ based on $N_{ref}$, N, and $N_{CB,max}$, where $N_{ref}$ represents a first reference code block size, N represents a size of the first code block, and $N_{CB}$ is a smallest value among $N_{CB,max}$, $N_{ref}$, and N.

$N_{ref}$ and $N_{CB,max}$ are used to indicate data buffer volumes of the receive end in different cases. $N_{ref}$ represents a value obtained when the receiving capability of the receive end is not limited, while $N_{CB,max}$ represents a value obtained based on the receiving capability of the receive end in the first transmission time (the receiving capability of the receive end may be limited in the first transmission time). The transmit end uses the smallest value among $N_{ref}$, N, and $N_{CB,max}$ as the code block size ($N_{CB}$) used for rate matching, so that a volume of data actually transmitted on a channel is not beyond the processing capability and/or the buffer capability that are/is of the receive end. This can avoid insufficiency in processing capability and/or buffer overflow when the receiving capability of the receive end is limited. For example, if the receiving capability of the receive end is limited in the first transmission time, and the first transport block is excessively large, N is greater than $N_{ref}$, and $N_{ref}$ is greater than $N_{CB,max}$. Then, the transmit end may use $N_{CB,max}$ as the code block size ($N_{CB}$) used for rate matching. $N_{ref}$ may be calculated according to a method described in section 5.4.2.1 of a communications standard (3GPP TS 38.212 V F.1.0). For a method for calculating $N_{CB,max}$ refer to a calculation method in another embodiment below.

Optionally, the determining $N_{CB,max}$ based on the receiving capability includes:

determining $N_{CB,max}$ based on $U^{(i)}$ and the receiving capability, where $N_{CB,max}$ is further positively correlated with $U^{(i)}$, $U^{(i)}$ represents a ratio of a transmission bandwidth of an active BWP of the carrier i to a sum of transmission bandwidths of active BWPs of all active receive carriers at the receive end, and the carrier i is used to transmit the first transport block.

When the receive end supports a plurality of carriers, the transmit end further needs to determine the receiving capability of the receive end on the carrier i based on a ratio of a transmission bandwidth of the carrier i to a sum of bandwidths of all activated receive carriers, where the receiving capability of the receive end on the carrier i is $U^{(i)}$ times of a total receiving capability of the receive end on a plurality of carriers. According to the foregoing optional method, insufficiency in processing capability and/or buffer overflow can be avoided at the receive end in a multi-carrier scenario. The transmission bandwidth of the carrier i may be a maximum bandwidth supported by the carrier i or another bandwidth. For a method for calculating $U^{(i)}$, refer to an embodiment below.

Optionally, S320 includes:

determining $N'_{ref}$ based on $TBS_{LBRM}$ and the maximum data processing volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data processing volume, and the maximum data processing volume is positively correlated with $P_{max}^{(i)}$ and $S^{(i)}$, where $P_{max}^{(i)}$ represents the maximum data rate on the carrier i, and $S^{(i)}$ represents the duration of the transmission time; and determining $N_{CB}$ based on N and $N'_{ref}$, where N represents a size of the first code block, and $N_{CB}$ is a smaller value between $N'_{ref}$ and N.

Optionally, the determining $N_{CB}$ based on the receiving capability includes: determining $N'_{ref}$ based on $TBS_{LBRM}$ and a maximum data transmission volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data transmission volume, the maximum data transmission volume is positively correlated with $TBS_{max}^{(i)}$ and $S^{(i)}$, and is positively correlated with a reciprocal of second transmission duration, $TBS_{max}^{(i)}$ represents a maximum size of a transport block that can be transmitted on the carrier i in the second transmission duration, $S^{(i)}$ represents duration for transmitting the first transport block (referred to as the first transmission time), and the second transmission time is transmission duration used to determine $TBS_{max}^{(i)}$; and determining $N_{CB}$ based on N and $N'_{ref}$, where N represents a size of the first code block, and $N_{CB}$ is a smaller value between $N'_{ref}$ and N.

In this optional solution, the transmit end selects the smaller value from $TBS_{LBRM}$ and the maximum data transmission volume on the carrier i in the first transmission time, and determines the reference code block size ($N'_{ref}$) based on the smaller value. Then, the transmit end compares $N'_{ref}$ and N, and selects the smaller value from $N'_{ref}$ and N as the code block size ($N_{CB}$) used for rate matching of the first code block, so that a volume of data actually transmitted on a channel is not beyond the processing capability and/or the buffer capability that are/is of the receive end. This can avoid insufficiency in processing capability and/or buffer overflow when the receiving capability of the receive end is limited. $TBS_{LBRM}$ may be calculated based on a maximum quantity of multiple-input multiple-output (multiple-input multiple-output, MIMO) layers, a maximum modulation order, and a maximum coding rate that are supported by the receive end, and $TBS_{LBRM}$ may be calculated according to a method described in section 5.4.2.1 of a communications standard (3GPP TS 38.212 V F.1.0).

Optionally, the maximum data transmission volume is further positively correlated with $U^{(i)}$, and $U^{(i)}$ represents a ratio of a transmission bandwidth of an active BWP of the carrier i to a sum of transmission bandwidths of active BWPs of all active receive carriers at the receive end.

When the receive end supports a plurality of carriers, the transmit end further needs to determine the receiving capability of the receive end on the carrier i based on a ratio of an active transmission bandwidth of the carrier i to a sum of bandwidths of all activated receive carriers, where the receiving capability of the receive end on the carrier i is $U^{(i)}$ times of a total receiving capability of the receive end on a plurality of carriers. According to the foregoing optional method, insufficiency in processing capability and/or buffer overflow can be avoided at the receive end in a multi-carrier scenario. For a method for calculating $U^{(i)}$, refer to an embodiment below.

Optionally, the first transport block is a high-priority transport block and includes C code blocks, and each of the C code blocks has a size of $N_{CB}$ before rate matching, where C is a positive integer. The method 300 further includes:

determining a data buffer volume for the high-priority transport block based on C and $N_{CB}$, where the data buffer volume for the high-priority transport block is $N_{CB} \cdot C$; determining a remaining data buffer volume based on the maximum data buffer volume on the carrier i in the first transmission time and the data buffer volume for the high-priority transport block, where the remaining data buffer volume is equal to the maximum data buffer volume minus $N_{CB} \cdot C$, the carrier i is used to transmit the first transport block, and the remaining data buffer volume is used for low-priority data; determining $N_{CB,lp}$ based on the remaining data buffer volume, where $N_{CB,lp}$ represents a code block size used for rate matching of a code block of a low-priority transport block, $N_{CB,lp}$ is a smallest value among $N_{lp}$, $N_{ref}$, and $N_{CB,max,lp}$, $N_{lp}$ represents a size of each code block of the low-priority transport block, $N_{ref}$ represents the first reference code block size, and $N_{CB,max,lp}$ represents a maximum data volume that is determined based on the remaining data buffer volume, that can be transmitted on the carrier i, and that is of the code block used for rate matching; and performing rate matching on the code block of the low-priority transport block based on $N_{CB,lp}$.

When a plurality of TBs need to be simultaneously transmitted, the transmit end may determine a rate matching parameter of each of the TBs based on a priority of the TB. To be specific, the transmit end determines a rate matching parameter of a high-priority TB according to the foregoing method. After determining a data buffer volume for the high-priority TB, the transmit end determines, based on a current remaining buffer resource, a size ($N_{CB,max,lp}$) of a code block that is of a low-priority TB and that can be transmitted on the carrier i; compares $N_{CB,max,lp}$, $N_{lp}$, and $N_{ref}$; and selects a smallest value from $N_{CB,max,lp}$, $N_{lp}$, and $N_{ref}$ as a code block size ($N_{CB,lp}$) used for rate matching of the code block of the low-priority TB, so that a volume of data actually transmitted on a channel is not beyond the processing capability and/or the buffer capability that are/is of the receive end. This can avoid insufficiency in processing capability and/or buffer overflow during reception of a low-priority TB when the receiving capability of the receive end is limited.

Optionally, the method 300 further includes:

receiving a notification message from the receive end, where the notification message is used to indicate that a size of data received by the receive end is beyond the receiving capability of the receive end; and reducing, based on the notification message, a size of data to be sent per unit time.

In the foregoing solution, a volume of data transmitted on a channel can be reduced in time, so that the volume of data actually transmitted on the channel is not beyond the processing capability and/or the buffering capability that are/is of the receive end.

Optionally, the notification message further includes a recommended transmission rate, and the recommended transmission rate is a data transmission rate that matches the receiving capability of the receive end.

The recommended transmission rate is a data transmission rate determined by the receive end based on the receiving capability in the current first transmission time. The transmit end determines, based on the recommended transmission rate, a code block size used for rate matching, so that the volume of data actually transmitted on the channel is not beyond the processing capability and/or the buffer capability that are/is of the receive end.

Optionally, the notification message is physical layer signaling, higher layer signaling, or MAC layer signaling.

With reference to FIG. 10, the following describes another rate matching method 1000 according to an embodiment of this application. The method includes S1010, S1020, and S1030.

S1010 is the same as S310 in the rate matching method 300 described above, S1030 is the same as S330 in the method 300, and specific implementations of S310 and S330 are also applicable to S1010 and S1030. Details are not described again.

S1020 is similar to S320 in the method 300, and a difference lies in that optionally, S1020 includes:

determining $N_{CB,max}$ based on a receiving capability of a receive end, where $N_{CB,max}$ represents a maximum size of a single code block that can be processed by the receive end in a first transmission time, and $N_{CB,max}$ is positively correlated with the receiving capability of the receive end; and determining $N_{CB}$ based on N and $N_{CB,max}$ where N represents a size of a first code block, and $N_{CB}$ is a smaller value between $N_{CB,max}$ and N.

$N_{CB,max}$ is used to indicate data buffer volumes of the receive end in different cases. $N_{CB,max}$ represents a value obtained based on the receiving capability of the receive end in the first transmission time (the receiving capability of the receive end may be limited in the first transmission time). The transmit end uses a smallest value among $N_{ref}$, N, and $N_{CB,max}$ as a code block size ($N_{CB}$) used for rate matching, so that a volume of data actually transmitted on a channel is not beyond processing capability and/or buffer capability that are/is of the receive end. This can avoid insufficiency in processing capability and/or buffer overflow when the receiving capability of the receive end is limited. For example, if the receiving capability of the receive end is limited in the first transmission time, and a first transport block is excessively large, N is greater than $N_{CB,max}$. Then, the transmit end may use $N_{CB,max}$ as the code block size ($N_{CB}$) used for rate matching. For a method for calculating $N_{CB,max}$ refer to a calculation method in another embodiment below. In this case, $N_{ref}$ described in the method 300 may not need to be obtained.

In addition, a specific implementation of S320 is also applicable to S1020. Details are not described again.

Other steps that may be included in the method 300 except S310, S320, and S330 and specific implementations of the other steps are also applicable to the method 1000. In addition, both a technical effect of the method 300 and descriptions of related terms of the method 300 are applicable to the method 1000. Details are not described again.

The foregoing describes in detail the rate matching methods provided in the embodiments of this application from a perspective of the transmit end. The following describes rate de-matching methods provided in the embodiments of this application from a perspective of a receive end.

FIG. 4 is a schematic diagram of a rate de-matching method according to an embodiment of this application. The method 400 shown in FIG. 4 is performed by a receive end, and the method 400 includes the following steps.

S410: Determine a receiving capability of the receive end, where the receiving capability is used to indicate a maximum data processing volume of the receive end in a first transmission time, and/or the receiving capability is used to indicate a maximum data buffer volume of the receive end in a first transmission time; and the first transmission time is used to receive a first transport block.

The receiving capability may refer to a maximum volume of data processed by the receive end per unit time. The receive end may calculate the maximum data processing volume of the receive end in the first transmission time based on the maximum volume of data processed by the receive end per unit time. The receiving capability may alternatively refer to a maximum volume of data that can be processed by the receive end in the first transmission time, or may refer to another parameter used to indicate the maximum data processing volume of the receive end in the first transmission time. Similarly, the receiving capability may alternatively refer to any parameter used to indicate the maximum data buffer size of the receive end in the first transmission time. This is not limited in this application.

It should be noted that, for the receive end, the first transmission time is a time for receiving the first transport block.

S420: Determine $N_{CB}$ based on the receiving capability, where $N_{CB}$ represents a code block size used for rate de-matching.

$N_{CB}$ represents a code block size that matches the receiving capability of the receive end. For example, the receive end can receive a maximum of X bits of data in the first transmission time. Then, $N_{CB}$ is less than or equal to a value obtained by dividing X by Y, where Y represents a quantity of code blocks into which the first transport block is segmented.

S430: Perform rate de-matching on the first transport block based on $N_{CB}$.

For example, a transmit end may select, from an MCS table, a modulation and coding parameter corresponding to $N_{CB,max}$ to perform rate de-matching on a first code block. For a specific rate de-matching method, refer to a rate de-matching method in the prior art. For brevity, details are not described herein.

According to the method provided in this embodiment, when the receiving capability of the receive end is relatively poor in the first transmission time, the transmit end may select a relatively small code block size for rate matching, to increase a coding rate and reduce a volume of data transmitted in the first transmission time. This avoids insufficiency in processing capability and/or buffer overflow at the receive end, and improves a receiving success rate. Alternatively, when the receiving capability of the receive end is relatively strong in the first transmission time, the transmit end may select a relatively large code block size for rate matching, to reduce a coding rate for a higher receiving success rate when a data volume is not beyond the receiving capability of the receive end.

Therefore, according to the rate matching method provided in this embodiment, the transmit end can adjust, based on a processing capability and/or a buffer capability that are/is of the receive end in a period of time (namely, the first transmission time), a code block size used for rate matching. This avoids insufficiency in processing capability and/or buffer overflow at the receive end, and improves a receiving success rate of the receive end.

Optionally, S310 includes:

determining the receiving capability based on $P_{max}^{(i)}$ and $S^{(i)}$, where $P_{max}^{(i)}$ represents a maximum data rate on a carrier i, the carrier i is used to transmit the first transport block, $S^{(i)}$ represents duration of the first transmission time of the first transport block, and the receiving capability of the receive end is positively correlated with both $P_{max}^{(i)}$ and $S^{(i)}$.

$P_{max}^{(i)}$ defines a maximum volume of data that can be processed on the carrier i per unit time. $S^{(i)}$ defines duration of data transmission. A maximum volume of data that can be processed and buffered by the receive end on the carrier i in the first transmission time may be obtained by combining $P_{max}^{(i)}$ and $S^{(i)}$. Therefore, the receiving capability of the receive end may be determined based on the maximum data rate on the carrier i and the duration of the first transmission time. For example, the receiving capability of the receive end is represented by $P_{max}^{(i)} \cdot S^{(i)}$ or $P_{max}^{(i)} \cdot S^{(i)}/R_{LBRM}$. For a method for calculating $P_{max}^{(i)}$ and a method for calculating $S^{(i)}$, refer to calculation methods in another embodiment below.

Optionally, S410 includes:

determining the receiving capability of the receive end based on $TBS_{max}^{(i)}$ and $S^{(i)}$, where $TBS_{max}^{(i)}$ represents a maximum size of a transport block that can be transmitted on a carrier i in second transmission time, $S^{(i)}$ represents duration of the first transmission time (referred to as first transmission duration), the carrier i is used to transmit the first transport block, the receiving capability of the receive end is positively correlated with both $TBS_{max}^{(i)}$ and $S^{(i)}$, the second transmission time is used to determine $TBS_{max}^{(i)}$, and the receiving capability of the receive end is negatively correlated with the second transmission time.

$TBS_{max}^{(i)}$ defines the maximum size of the transport block that can be transmitted on the carrier i in the second transmission time. A greater value of $TBS_{max}^{(i)}$ indicates a larger volume of data transmitted on the carrier i in a same transmission time, or indicates a shorter second transmission time when a same volume of data is transmitted on the carrier i. A greater value of $TBS_{max}^{(i)}$ also indicates a larger volume of data processed by the receive end per unit time. Therefore, a greater value of $TBS_{max}^{(i)}$ indicates a stronger receiving capability of the receive end. A peak processing rate of the receive end is equal to $TBS_{max}^{(i)}$ divided by the second transmission time. Therefore, the receiving capability of the receive end may be defined by $TBS_{max}^{(i)}$, $S^{(i)}$, and the second transmission time. For example, the receiving capability of the receive end is represented by $TBS_{max}^{(i)} \cdot S^{(i)}/S_2^{(i)}$ or $[TBS_{max}^{(i)} \cdot S^{(i)}/S_2^{(i)}]/R_{LBRM}$, where $S_2^{(i)}$ represents the second transmission time. For example, if the second transmission time is 1 ms, $TBS_{max}^{(i)}$ represents a maximum size of a transport block that can be transmitted on the carrier i within 1 ms.

$TBS_{max}^{(i)}$ may be calculated based on a maximum quantity of multiple-input multiple-output (MIMO) layers, a maximum modulation order, and a maximum coding rate that are supported by the receive end, and $TBS_{max}^{(i)}$ is calculated according to a method described in section 5.1.3.2 of a communications standard (3GPP TS 38.214 V F.1.0) and by using a maximum bandwidth of the carrier i as a maximum configured BWP and a minimum subcarrier spacing supported by the carrier i as a subcarrier spacing. The second transmission time is a slot length corresponding to the minimum subcarrier spacing supported by the carrier i. For example, if the subcarrier spacing is 30 kHz, duration of the second transmission time is 0.5 ms. $TBS_{max}^{(i)}$ may further be obtained based on a maximum data rate $P_{max}^{(i)}$ of the receive end on the carrier i. For example, $TBS_{max}^{(i)} = TBS_{max}^{(i)} \cdot S_2^{(i)}$. $TBS_{max}^{(i)}$ may further be obtained based on a device type of the receive end. For example, if the device type of the receive end is LTE UE Category (Category) 6, $TBS_{max}^{(i)} = 149776$ bits, and $S_2^{(i)} = 1$ millisecond.

Optionally, S420 includes:

determining $N_{CB,max}$ based on the receiving capability of the receive end, where $N_{CB,max}$ represents a maximum size of a single code block that can be processed by the receive end in the first transmission time, and $N_{CB,max}$ is positively correlated with the receiving capability of the receive end; and determining $N_{CB}$ based on $N_{ref}$, N, and $N_{CB,max}$, where $N_{ref}$ represents a first reference code block size, N represents a size of the first code block, and $N_{CB}$ is a smallest value among $N_{CB,max}$, $N_{ref}$, and N.

$N_{ref}$ and $N_{CB,max}$ are used to indicate data buffer volumes of the receive end in different cases. $N_{ref}$ represents a value obtained when the receiving capability of the receive end is not limited, and $N_{CB,max}$ represents a value obtained based on the receiving capability of the receive end in the first transmission time (the receiving capability of the receive end may be limited in the first transmission time). The receive end uses the smallest value among $N_{ref}$, N, and $N_{CB,max}$ as the code block size ($N_{CB}$) used for rate de-matching, so that a volume of data actually processed and buffered in the first transmission time is not beyond the receiving capability of the receive end. This can avoid insufficiency in processing capability and/or buffer overflow when the receiving capability of the receive end is limited. For example, if the receiving capability of the receive end is limited in the first transmission time, and the first transport block is excessively large, N is greater than $N_{ref}$, and $N_{ref}$ is greater than $N_{CB,max}$. Then, the receive end may use $N_{CB,max}$ as the code block size ($N_{CB}$) used for rate de-matching. $N_{ref}$ may be calculated according to a method described in section 5.4.2.1 of a communications standard (3GPP TS 38.212 V F.1.0). For a method for calculating $N_{CB,max}$ refer to a calculation method in another embodiment below.

Optionally, the determining $N_{CB,max}$ based on the receiving capability includes:

determining $N_{CB,max}$ based on $U^{(i)}$ and the receiving capability, where $N_{CB,max}$ is further positively correlated with $U^{(i)}$, $U^{(i)}$ represents a ratio of a transmission bandwidth of an active BWP of the carrier i to a sum of transmission bandwidths of BWPs of all active receive carriers at the receive end, and the carrier i is used to transmit the first transport block.

When the receive end supports a plurality of carriers, the transmit end further needs to determine the receiving capability of the receive end on the carrier i based on a ratio of a transmission bandwidth of the carrier i to a sum of bandwidths of all activated receive carriers, where the receiving capability of the receive end on the carrier i is $U^{(i)}$ times of a total receiving capability of the receive end on a plurality of carriers. According to foregoing optional method, insufficiency in processing capability and/or buffer overflow can be avoided at the receive end in a multi-carrier scenario. For a method for calculating $U^{(i)}$, refer to an embodiment below.

Optionally, S420 includes:

determining $N'_{ref}$ based on $TBS_{LBRM}$ and the maximum data processing volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data processing volume, and the maximum data processing volume is positively correlated with $P_{max}^{(i)}$ and $S^{(i)}$, where $P_{max}^{(i)}$ represents the maximum data rate on the carrier i, and $S^{(i)}$ represents the duration of the transmission time; and determining $N_{CB}$ based on N and $N'_{ref}$, where N represents a size of the first code block, and $N_{CB}$ is a smaller value between $N'_{ref}$ and N.

In this optional solution, the receive end selects the smaller value from $TBS_{LBRM}$ and the maximum data transmission volume on the carrier i in the first transmission time, and determines the reference code block size ($N'_{ref}$) based on the smaller value. Then, the receive end compares $N'_{ref}$ and N, and selects the smaller value from $N'_{ref}$ and N as the code block size ($N_{CB}$) used for rate de-matching of the first code block, so that a volume of data actually processed by the receive end in the first transmission time is not beyond the receiving capability of the receive end. This can avoid insufficiency in processing capability and/or buffer overflow when the receiving capability of the receive end is limited. $TBS_{LBRM}$ may be calculated based on a maximum quantity of MIMO layers, a maximum modulation order, and a maximum coding rate that are supported by the receive end, and $TBS_{LBRM}$ may be calculated according to a method described in section 5.4.2.1 of a communications standard (3GPP TS 38.212 V F.1.0).

Optionally, the maximum data transmission volume is further positively correlated with $U^{(i)}$, and $U^{(i)}$ represents a ratio of a transmission bandwidth of an active BWP of the carrier i to a sum of transmission bandwidths of active BWPs of all active receive carriers at the receive end.

When the receive end supports a plurality of carriers, the receive end further needs to determine the receiving capability of the receive end on the carrier i based on the ratio of the transmission bandwidth of the active BWP of the carrier i to the sum of the bandwidths of the active BWPs of all the active receive carriers, where the receiving capability of the receive end on the carrier i is $U^{(i)}$ times of a total receiving capability of the receive end on a plurality of carriers. According to the foregoing optional method, insufficiency in processing capability and/or buffer overflow can be avoided at the receive end in a multi-carrier scenario. For a method for calculating $U^{(i)}$, refer to an embodiment below.

Optionally, the first transport block is a high-priority transport block and includes C code blocks, and each of the C code blocks has a size of $N_{CB}$ before rate matching, where C is a positive integer. The method 400 further includes:

determining a data buffer volume for the high-priority transport block based on C and $N_{CB}$, where the data buffer volume for the high-priority transport block is $N_{CB} \cdot C$; determining a remaining data buffer volume based on the maximum data buffer volume on the carrier i in the first transmission time and the data buffer volume for the high-priority transport block, where the remaining data buffer volume is equal to the maximum data buffer volume minus $N_{CB} \cdot C$, the carrier i is used to transmit the first transport block, and the remaining data buffer volume is used for low-priority data; determining $N_{CB,lp}$ based on the remaining data buffer volume, where $N_{CB,lp}$ represents a code block size used for rate matching of a code block of a low-priority transport block, $N_{CB,lp}$ is a smallest value among $N_{lp}$, $N_{ref}$, and $N_{CB,max,lp}$, $N_{lp}$ represents a size of each code block of the low-priority transport block, $N_{ref}$ represents the first reference code block size, and $N_{CB,max,lp}$ represents a maximum data volume that is determined based on the remaining data buffer volume, that can be transmitted on the carrier i, and that is of the code block used for rate matching; and performing rate matching on the code block of the low-priority transport block based on $N_{CB,lp}$.

When a plurality of TBs need to be simultaneously transmitted, the receive end may determine, based on a priority of each of the TBs, a code block size used for rate de-matching of the TB. To be specific, the receive end determines a code block size used for rate de-matching of a high-priority TB according to the foregoing method. After determining a data buffer volume required for rate de-matching of the high-priority TB, the receive end determines, based on a current remaining data buffer volume, a size ($N_{CB,max,lp}$) of a code block that is of a low-priority TB and that can be transmitted on the carrier i; compares $N_{CB,max,lp}$, $N_{lp}$, and $N_{ref}$; and selects a smallest value from $N_{CB,max,lp}$, $N_{lp}$, and $N_{ref}$ as a code block size ($N_{CB,lp}$) used for rate de-matching of the code block of the low-priority TB, so that a volume of data actually processed by the receive end in the first transmission time is not beyond the receiving capability of the receive end. This can avoid insufficiency in processing capability and/or buffer overflow during reception of a low-priority TB when the receiving capability of the receive end is limited.

Optionally, the method 400 further includes:

sending a notification message to the transmit end, where the notification message is used to indicate that a size of data received by the receive end is beyond the receiving capability of the receive end.

In the foregoing solution, a volume of data transmitted on a channel can be reduced in time, so that the volume of data actually transmitted on the channel is not beyond the processing capability and/or the buffering capability that are/is of the receive end.

Optionally, the notification message further includes a recommended transmission rate, and the recommended transmission rate is a data transmission rate that matches the receiving capability of the receive end.

The recommended transmission rate is a data transmission rate determined by the receive end based on the receiving capability in the current first transmission time. The transmit end determines, based on the recommended transmission rate, a code block size used for rate matching, so that the volume of data actually transmitted on the channel is not beyond the processing capability and/or the buffer capability that are/is of the receive end.

Optionally, the notification message is physical layer signaling, higher layer signaling, or MAC layer signaling.

With reference to FIG. 11, the following describes another rate de-matching method 1100 according to an embodiment of this application. The method includes S1110, S1120, and S1130.

S1110 is the same as S410 in the rate de-matching method 400 described above, S1130 is the same as S430 in the method 400, and specific implementations of S410 and S430 are also applicable to S1110 and S1130. Details are not described again.

S1120 is similar to S420 in the method 400, and a difference lies in that optionally, S1120 includes:

determining $N_{CB,max}$ based on a receiving capability of a receive end, where $N_{CB,max}$ represents a maximum size of a single code block that can be processed by the receive end in a first transmission time, and $N_{CB,max}$ is positively correlated with the receiving capability of the receive end; and determining $N_{CB}$ based on N and $N_{CB,max}$, where N represents a size of a first code block, and $N_{CB}$ is a smaller value between $N_{CB,max}$ and N.

$N_{CB,max}$ is used to indicate data buffer volumes of the receive end in different cases. $N_{CB,max}$ represents a value obtained based on the receiving capability of the receive end in the first transmission time (the receiving capability of the receive end may be limited in the first transmission time). A transmit end uses a smallest value among $N_{ref}$, N, and $N_{CB,max}$ as a code block size ($N_{CB}$) used for rate matching, so that a volume of data actually transmitted on a channel is not beyond processing capability and/or buffer capability that are/is of the receive end. This can avoid insufficiency in processing capability and/or buffer overflow when the receiving capability of the receive end is limited. For example, if the receiving capability of the receive end is limited in the first transmission time, and a first transport block is excessively large, N is greater than $N_{CB,max}$. Then, the transmit end may use $N_{CB,max}$ as the code block size ($N_{CB}$) used for rate matching. For a method for calculating $N_{CB,max}$, refer to a calculation method in another embodiment below. In this case, $N_{ref}$ described in the method 400 may not need to be obtained.

In addition, a specific implementation of S420 is also applicable to S1120. Details are not described again.

Other steps that may be included in the method 400 except S410, S420, and S430 and specific implementations of the other steps are also applicable to the method 1100. In addition, both a technical effect of the method 400 and descriptions of related terms of the method 400 are applicable to the method 1100. Details are not described again.

The following further provides several embodiments of rate buffering provided in the embodiments of this application.

Embodiment 1

A transmit end calculates, in the following manner, a code block size $N_{CB}$ used for rate matching, and a receive end calculates, in the following manner, a code block size $N_{CB}$ used for rate de-matching. Unless otherwise specified, carriers described in this embodiment all refer to a carrier used to transmit a first TB.

Step 1: Calculate $TBS_{LBRM}$ and $N_{ref}$ according to a method described in section 5.4.2.1 in a communications standard (3GPP TS 38.212 V F.1.0).

Step 2: Calculate, based on a receiving capability of the receive end on a current carrier (namely, a carrier i) and a first transmission time of currently scheduled data, a maximum size $N_{CB}$ of a single code block that can be processed by the receive end in the first transmission time.

Step 3: Calculate $N_{CB,max}$ where $N_{CB}=\min(N, N_{ref}, N_{CB,max})$.

N represents a size of an encoded code block.

A manner of calculating $N_{CB,max}$ is as follows:

Determine a maximum data rate $P_{max}^{(i)}$ of the carrier I (also referred to as a peak rate or maximum transmission rate on the carrier i).

Determine a maximum volume $TB_{max,S^{(i)}}^{(i)}$ of data that can be processed on the carrier i in the current first transmission time.

Calculate $N_{CB,max}$ based on $TB_{max,S^{(i)}}^{(i)}$, where a calculation manner is $$N_{CB,max} = \left\lfloor \frac{TB_{max,S^{(i)}}^{(i)}}{C \cdot R_{LBRM}} \right\rfloor, \text{ and } \left\lfloor \frac{TB_{max,S^{(i)}}^{(i)}}{C \cdot R_{LBRM}} \right\rfloor \text{ indicates that } \frac{TB_{max,S^{(i)}}^{(i)}}{C \cdot R_{LBRM}}$$

is rounded down.

A manner of calculating $TB_{max,S^{(i)}}^{(i)}$ is $TB_{max,S^{(i)}}^{(i)} = P_{max}^{(i)} \cdot S^{(i)}$.

A manner of calculating the maximum data rate $P_{max}^{(i)}$ of the carrier i is as follows:

$$P_{max}^{(i)} = v_{Layers}^{(i)} \cdot Q_m^{(i)} \cdot f^{(i)} \cdot R_{max} \cdot \frac{N_{PRB}^{BW(i),\mu} \cdot 12}{T_s^\mu} \cdot (1 - OH^{(i)}) \text{ Mbps.}$$

$R_{max}$=948/1024 ("/" indicates a division operation).

$v_{Layers}^{(i)}$ represents a maximum quantity of MIMO layers on the CC i.

$Q_m^{(i)}$ represents a maximum modulation order of the CC i.

$f^{(i)}$ represents a scale factor of the CC i, and may have a value of 1, 0.75, or another number less than 1 and greater than 0. The value may be used as a parameter that indicates a receiving capability of a terminal and that is reported by the terminal to a base station.

μ is used to indicate different subcarrier spacings. If SCS=15 kHz, μ=0; if SCS=30 kHz, μ=1; if SCS=60 kHz, μ=2; and if SCS=120 kHz, μ=3.

$T_s^\mu$ represents average symbol lengths corresponding to different subcarrier spacings in one subframe (1 ms). That is, $$T_s^\mu = \frac{10^{-3}}{14 \cdot 2^\mu}.$$

$N_{PRB}^{BW(j),\mu}$ represents a maximum resource block (resource block, RB) quantity corresponding to a maximum bandwidth $BW^{(i)}$ with a corresponding subcarrier spacing μ, where the maximum bandwidth $BW^{(i)}$ is supported by the terminal in a given band or band combination.

$OH^{(j)}$ represents a redundancy factor, and has different values depending on whether the current CC is uplink CC or downlink CC, and a frequency band in which the current CC is located. For example, values of $OH^{(j)}$ are as follows:

0.14, for a frequency range FR1 for downlink (for frequency range FR1 for DL);

0.18, for a frequency range FR2 for downlink (for frequency range FR2 for DL);

0.08, for a frequency range FR1 for uplink (for frequency range FR1 for UL); and 0.10, for a frequency range FR2 for uplink (for frequency range FR2 for UL).

$S^{(i)}$ represents a transmission time of the first transport block, and may use an absolute time, such as actual transmission duration of the first transport block, for representation. Alternatively, $S^{(i)}$ may use an equivalent transmission time of the first transport block for representation. For example, a calculation manner is $$S^{(i)} = T_{slot} \cdot \frac{N_{RE}^{(i)}}{N_{RE}}.$$

$T_{slot}$ represents a slot length obtained based on a current scheduling parameter. For example, if SCS=15 kHz, $T_{slot}$=1 ms; if SCS=30 kHz, $T_{slot}$=0.5 ms; if SCS=60 kHz, $T_{slot}$=0.25 ms; if SCS=120 kHz, $T_{slot}$=0.125 ms; and if SCS=240 kHz, $T_{slot}$=0.125 ms.

$N_{RE}$ represents a quantity of resource elements (resource element, RE) in one slot, and has different values based on different designed parameters. In an example, when SCS=15/30/60/120 kHz, $N_{RE}$=156; and when SCS=240 kHz, $N_{RE}$=312.

$N_{RE}^{(i)}$ represents a quantity of currently scheduled REs, and $N'_{RE}=N_{sc}^{RB} \cdot N_{symb}^{sh} - N_{DMRS}^{PRB} - N_{oh}^{PRB}$. The transmit end or the receive end determines a quantity ($N'_{RE}$) of REs in one PRB. $N_{sc}^{RB}$=12 indicates that 12 subcarriers are included in one PRB in frequency domain. $N_{symb}^{sh}$ represents a quantity of symbols of a physical channel carrying current data, and values of $N_{symb}^{sh}$ may be 1 to 14. $N_{DMRS}^{PRB}$ represents a quantity of REs that are included in a demodulation reference signal (demodulation reference signal, DMRS) and that are in one PRB in a scheduling time, and values of $N_{DMRS}^{PRB}$ may be 3 to 48 or another value based on a configuration parameter of current scheduling. $N_{oh}^{PRB}$ represents an overhead-related parameter, and a value of $N_{oh}^{PRB}$ is one of {0, 6, 12, 18}. If a higher layer does not configure the parameter, the value of $N_{oh}^{PRB}$ is 0.

$$S^{(i)} = T_{slot} \cdot \frac{N_{symb}^{(i)}}{N_{symb}^{slot}}.$$

A manner of calculating $S^{(i)}$ is $N_{symb}^{(i)}$ represents a quantity of symbols of a physical channel carrying current data, and values of $N_{symb}^{(i)}$ may be 1 to 14.

$N_{symb}^{slot}$ represents a quantity of symbols in one slot. A value of $N_{symb}^{slot}$ may be a fixed value such as 12, 14, 24, or 28, and is determined based on a current frame format.

A manner of calculating $S^{(i)}$ is $$S^{(i)} = T_{slot} \cdot \frac{n_{PRB}^{(i)}}{n_{PRB}} \cdot \frac{N_{RE}^{(i)}}{N_{RE}}.$$

A value of $n_{PRB}$ may be a fixed value. For example, the value of $n_{PRB}$ is fixed to a maximum PRB quantity supported by each component carrier (component carrier, CC), for example, 273. Alternatively, a largest PRB quantity in PRB quantities corresponding to all subcarrier spacings (sub-carrier spacing, SCS) for a maximum bandwidth of the current carrier is selected, based on a frequency band in which the CC is located and a bandwidth of the CC, as the value of $n_{PRB}$. If a maximum bandwidth of a CC is 100 MHz, and the CC is located in a sub-6 GHz frequency band, $n_{PRB}$ for the CC is equal to 273 with reference to Table 1. If the maximum bandwidth of the CC is 50 MHz, $n_{PRB}$ for the CC is equal to 270.

If the maximum bandwidth of the CC is 100 MHz, and the CC is located in a frequency band above 6 GHz, $n_{PRB}$ for the CC is equal to 132 with reference to Table 2.

TABLE 1

| SCS (kHz) | 5 MHz $N_{RB}$ | 10 MHz $N_{RB}$ | 15 MHz $N_{RB}$ | 20 MHz $N_{RB}$ | 25 MHz $N_{RB}$ | 30 MHz $N_{RB}$ | 40 MHz $N_{RB}$ | 50 MHz $N_{RB}$ | 60 MHz $N_{RB}$ | 80 MHz $N_{RB}$ | 100 MHz $N_{RB}$ |
|---|---|---|---|---|---|---|---|---|---|---|---|
| 15 | 25 | 52 | 79 | 106 | 133 | [160] | 216 | 270 | N/A | N/A | N/A |
| 30 | 11 | 24 | 38 | 51 | 65 | [78] | 106 | 133 | 162 | 217 | 273 |
| 60 | N/A | 11 | 18 | 24 | 31 | [38] | 51 | 65 | 79 | 107 | 135 |

TABLE 2

| SCS (kHz) | 50 MHz $N_{RB}$ | 100 MHz $N_{RB}$ | 200 MHz $N_{RB}$ | 400 MHz $N_{RB}$ |
|---|---|---|---|---|
| 60 | 66 | 132 | 264 | N/A |
| 120 | 32 | 66 | 132 | 264 |

$n_{PRB}{}^{(i)}$ represents a quantity of PRBs in frequency domain that are of currently scheduled data, namely, the first TB. $n_{PRB}{}^{(i)} \leq n_{PRB}$.

A manner of calculating $S^{(i)}$ is $$S^{(i)} = \frac{n_{PRB}^{(i)}}{n_{PRB}} \cdot \frac{N_{symb}^{(i)}}{N_{symb}^{slot}} \cdot T_{slot},$$

where a meaning of each parameter is described above.

Another implementation of $TB_{max,S^{(i)}}{}^{(i)}$ is $$TB_{max,s^{(i)}}^{(i)} = \frac{TBS_{max}^{(i)}}{S_2^{(i)}} \cdot S^{(i)}.$$

$TBS_{max}{}^{(i)}$ may be calculated based on a maximum quantity of multiple-input multiple-output (multiple-input multiple-output, MIMO) layers, a maximum modulation order, and a maximum coding rate that are supported by the receive end, and $TBS_{max}{}^{(i)}$ is calculated according to a method described in section 5.1.3.2 of a communications standard (3GPP TS 38.214 V F.1.0) and by using a maximum bandwidth of the carrier i as a maximum configured BWP and a minimum subcarrier spacing supported by the carrier i as a subcarrier spacing. A second transmission time is a slot length corresponding to the minimum subcarrier spacing supported by the carrier i. For example, if the subcarrier spacing is 30 kHz, duration of the second transmission time is 0.5 ms. $TBS_{max}{}^{(i)}$ may further be obtained based on the maximum data rate $P_{max}{}^{(i)}$ of the receive end on the carrier i. For example, $TBS_{max}{}^{(i)} = P_{max}{}^{(i)} \cdot S_2{}^{(i)}$, where $S_2{}^{(i)}$ represents the duration of the second transmission time. $TBS_{max}{}^{(i)}$ may further be obtained based on a device type of the receive end. For example, if the device type of the receive end is LTE UE Category 6, $TBS_{max}{}^{(i)} = 149776$ bits, and $S_2{}^{(i)} = 1$ millisecond.

Embodiment 2

A transmit end calculates, in the following manner, a code block size $N_{CB}$ used for rate matching, and a receive end calculates, in the following manner, a code block size $N_{CB}$ used for rate de-matching. Unless otherwise specified, carriers described in this embodiment all refer to a carrier used to transmit a first TB.

Step 1: Calculate, based on a receiving capability of the receive end on a current carrier (namely, a carrier i) and a first transmission time of currently scheduled data, a maximum size $N_{CB,max}$ of a single code block that can be processed by the receive end in the first transmission time.

Step 2: Calculate $N_{CB,max}$ where $N_{CB}$ min($N, N_{CB,max}$).

N represents a size of an encoded code block. A manner of calculating $N_{CB,max}$ is the same as the manner of calculating $N_{CB,max}$ in Embodiment 1. Details are not described again.

Embodiment 3

A transmit end calculates, in the following manner, a code block size $N_{CB}$ used for rate matching, and a receive end calculates, in the following manner, a code block size $N_{CB}$ used for rate de-matching. Unless otherwise specified, carriers described in this embodiment all refer to a carrier used to transmit a first TB.

Step 1: Calculate $TBS_{LBRM}$ according to a method described in section 5.4.2.1 in a communications standard (3GPP TS 38.212 V F.1.0).

Step 2: Calculate $N_{ref}'$ based on a receiving capability of the receive end on a current carrier (namely, a carrier i) and a first transmission time of currently scheduled data, where $$N_{ref}' = \left\lfloor \frac{TBS_{LBRM}^{(i)}}{C \cdot R_{LBRM}} \right\rfloor, \left\lfloor \frac{TBS_{LBRM}^{(i)}}{C \cdot R_{LBRM}} \right\rfloor$$

indicates that $$\frac{TBS_{LBRM}^{(i)}}{C \cdot R_{LBRM}}$$

is rounded down, and $TBS_{LBRM}{}^{(i)} = \min(TBS_{LBRM}, P_{max}{}^{(i)} \cdot S^{(i)})$. For a method for calculating $P_{max}{}^{(i)} \cdot S^{(i)}$, refer to Embodiment 1.

Another implementation of $TBS_{LBRM}{}^{(i)}$ is $TBS_{LBRM}{}^{(i)} = \min(TBS_{LBRM}, TBS_{max,S^{(i)}}{}^{(i)})$, where $$TBS_{max,s^{(i)}}^{(i)} = \frac{TBS_{max}^{(i)}}{S_2^{(i)}} \cdot S^{(i)} \cdot TBS_{max}^{(i)}$$

may be calculated based on a maximum quantity of multiple-input multiple-output (multiple-input multiple-output, MIMO) layers, a maximum modulation order, and a maximum coding rate that are supported by the receive end, and $TBS_{max}{}^{(i)}$ is calculated according to a method described in section 5.1.3.2 of a communications standard (3GPP TS 38.214 V F.1.0) and by using a maximum bandwidth of the carrier i as a maximum configured BWP and a minimum subcarrier spacing supported by the carrier i as a subcarrier spacing. A second transmission time is a slot length corresponding to the minimum subcarrier spacing supported by the carrier i. For example, if the subcarrier spacing is 30 kHz, duration of the second transmission time is 0.5 ms. $TBS_{max}^{(i)}$ may further be obtained based on a maximum data rate $P_{max}^{(i)}$ of the receive end on the carrier i. For example, $TBS_{max}^{(i)} = P_{max}^{(i)} \cdot S_2^{(i)}$, where $S_2^{(i)}$ represents the duration of the second transmission time. $TBS_{max}^{(i)}$ may further be obtained based on a device type of the receive end. For example, if the device type of the receive end is LTE UE Category 6, $TBS_{max}^{(i)} = 149776$ bits, and $S_2^{(i)} = 1$ millisecond.

Step 3: Calculate $N_{CB,max}$ where $N_{CB} = \min(N, N_{ref})$.

Embodiment 4

In Embodiment 1, Embodiment 2, and Embodiment 3, only a case of a single carrier is considered. If a receiving end supports a plurality of carriers, $N_{CB}$ is further calculated based on a total maximum data rate of the receiving end and scheduling duration of all currently scheduled TBs. Embodiment 1 is used as an example. For a plurality of carriers:

Step 1: Calculate $TBS_{LBRM}$ and $N_{ref}$ according to a method described in section 5.4.2.1 in a communications standard (3GPP TS 38.212 V F.1.0).

Step 2: Calculate, based on a receiving capability of the receive end on a current carrier (namely, a carrier i) and a first transmission time of currently scheduled data, a maximum size $N_{CB,max}$ of a single code block that can be processed by the receive end on the current carrier in the first transmission time.

A calculation manner is $$N_{CB,max} = \left\lfloor \frac{P_{max} \cdot S^{(i)} \cdot U^{(i)}}{C \cdot R_{LBRM}} \right\rfloor, \text{ where } \left\lfloor \frac{P_{max} \cdot S^{(i)} \cdot U^{(i)}}{C \cdot R_{LBRM}} \right\rfloor$$

indicates that $$\frac{P_{max} \cdot S^{(i)} \cdot U^{(i)}}{C \cdot R_{LBRM}}$$

is rounded down, and $P_{max}$ represents the total maximum data rate of the receive end.

$$P_{max} = \sum_{j=1}^{J} \left( v_{Layers}^{(j)} \cdot Q_m^{(j)} \cdot f^{(j)} \cdot R_{max} \cdot \frac{N_{PRB}^{BW(j),\mu} \cdot 12}{T_s^\mu} \cdot (1 - OH^{(j)}) \right)$$

$$U^{(i)} = \frac{BWP^{(i)}}{\sum_{k=1}^{K_{active}} BWP^{(k)}}, \text{ where } BWP^{(i)}$$

represents a bandwidth part (bandwidth part, BWP) of the current transmission carrier i, $K_{active}$ represents a total quantity of active BWPs of all current active receive carriers of the receive end, and $BWP^{(k)}$ represents a currently scheduled BWP of the transmission carrier i. In the foregoing formula of $P_{max}$, j may have a value of i.

A method for calculating $S^{(i)}$ is the same as the method for calculating $S^{(i)}$ in Embodiment 1.

Step 3: Calculate $N_{CB}$ where $N_{CB} = \min(N, N_{ref}, N_{CB,max})$.
N represents a size of an encoded code block.

Embodiment 5

In Embodiment 1, Embodiment 2, and Embodiment 3, only a case of a single carrier is considered. If a receiving end supports a plurality of carriers, $N_{CB}$ is further calculated based on a total maximum data rate of the receiving end and scheduling duration of all currently scheduled TBs. Embodiment 1 is used as an example. For a plurality of carriers:

Step 1: Calculate, based on a receiving capability of the receive end on a current carrier (namely, a carrier i) and a first transmission time of currently scheduled data, a maximum size $N_{CB,max}$ of a single code block that can be processed by the receive end on the current carrier in the first transmission time.

A calculation manner is $$N_{CB,max} = \left\lfloor \frac{P_{max} \cdot S^{(i)} \cdot U^{(i)}}{C \cdot R_{LBRM}} \right\rfloor, \text{ where } \left\lfloor \frac{P_{max} \cdot S^{(i)} \cdot U^{(i)}}{C \cdot R_{LBRM}} \right\rfloor$$

indicates that $$\frac{P_{max} \cdot S^{(i)} \cdot U^{(i)}}{C \cdot R_{LBRM}}$$

is rounded down, and $P_{max}$ represents the total maximum data rate of the receive end.

$$P_{max} = \sum_{j=1}^{J} \left( v_{Layers}^{(j)} \cdot Q_m^{(j)} \cdot f^{(j)} \cdot R_{max} \cdot \frac{N_{PRB}^{BW(j),\mu} \cdot 12}{T_s^\mu} \cdot (1 - OH^{(j)}) \right)$$

$$U^{(i)} = \frac{BWP^{(i)}}{\sum_{k=1}^{K_{active}} BWP^{(k)}},$$

where $BWP^{(i)}$ represents a bandwidth part (bandwidth part, BWP) of the current transmission carrier i, $K_{active}$ represents a total quantity of active BWPs of all current active receive carriers of the receive end, and $BWP^{(k)}$ represents a currently scheduled BWP of the transmission carrier i. In the foregoing formula of $P_{max}$, j may have a value of i.

A method for calculating $S^{(i)}$ is the same as the method for calculating $S^{(i)}$ in Embodiment 1.

Step 2: Calculate $N_{CB,max}$ where $N_{CB} = \min(N, N_{CB,max})$.

N represents a size of an encoded code block.

Embodiment 6

Further, when a plurality of TBs is simultaneously transmitted, a transmit end and a receive end may determine, based on different priorities of the TBs, code block sizes used for rate matching of code blocks of the different TBs, to ensure that a high-priority service (a high-priority TB) can be transmitted at a relatively low coding rate.

For example, for the high-priority TB, calculation may be performed in the following manner:

Step 1: Calculate $TBS_{LBRM}$ and $N_{ref}$ according to a method described in section 5.4.2.1 in a communications standard (3GPP TS 38.212 V F.1.0).

Step 2: Calculate, based on a receiving capability of the receive end and a first transmission time of currently scheduled data, a maximum volume $N_{CB,max}$ of data that can be processed on a carrier i in the first transmission time of the current data. A calculation manner is $$N_{CB,max} = \left\lfloor \frac{P_{max} \cdot S^{(i)}}{C \cdot R_{LBRM}} \right\rfloor,$$

where $P_{max}$ represents a total maximum data rate of the receive end.

$$P_{max} = \sum_{j=1}^{J} \left( v_{Layers}^{(j)} \cdot Q_m^{(j)} \cdot f^{(j)} \cdot R_{max} \cdot \frac{N_{PRB}^{BW(j),\mu} \cdot 12}{T_s^\mu} \cdot (1 - OH^{(j)}) \right)$$

A method for calculating $S^{(i)}$ is the same as the method for calculating $S^{(i)}$ in Embodiment 1. In the foregoing formula of $P_{max}$, j may have a value of i.

Step 3: $N_{CB} = \min(N, N_{ref}, N_{CB,max})$.

N represents a size of an encoded code block.

Embodiment 7

Further, when a plurality of TBs is simultaneously transmitted, a transmit end and a receive end may determine, based on different priorities of the TBs, code block sizes used for rate matching of code blocks of the different TBs, to ensure that a high-priority service (a high-priority TB) can be transmitted at a relatively low coding rate.

For example, for the high-priority TB, calculation may be performed in the following manner:

Step 1: Calculate, based on a receiving capability of the receive end and a first transmission time of currently scheduled data, a maximum volume $N_{CB,max}$ of data that can be processed on a carrier i in the first transmission time of the current data. A calculation manner is $$N_{CB,max} = \left\lfloor \frac{P_{max} \cdot S^{(i)}}{C \cdot R_{LBRM}} \right\rfloor,$$

where $P_{max}$ represents a total maximum data rate of the receive end.

$$P_{max} = \sum_{j=1}^{J} \left( v_{Layers}^{(j)} \cdot Q_m^{(j)} \cdot f^{(j)} \cdot R_{max} \cdot \frac{N_{PRB}^{BW(j),\mu} \cdot 12}{T_s^\mu} \cdot (1 - OH^{(j)}) \right)$$

A method for calculating $S^{(i)}$ is the same as the method for calculating $S^{(i)}$ in Embodiment 1. In the foregoing formula of $P_{max}$, j may have a value of i.

Step 2: $N_{CB} = \min(N, N_{CB,max})$.

N represents a size of an encoded code block.

Embodiment 8

A resource remained after high-priority scheduling is used for transmission of a low-priority service. If a code block size used for rate matching of a code block of a high-priority TB is $N_{CB,hp}$, $N_{CB,hp} = N_{CB,max}$ and a quantity of code blocks of the high-priority TB is $C_{hp}$, a resource remained after the code block of the high-priority TB uses a resource is $P_{max} \cdot S^{(i)} / R_{LBRM} - C_{hp} \cdot N_{CB,hp}$. Specifically:

Step 1: Calculate $TBS_{LBRM}$ and $N_{ref}$ according to a method described in section 5.4.2.1 in a communications standard (3GPP TS 38.212 V F.1.0).

Step 2: Calculate, based on a receiving capability of the receive end and a first transmission time of currently scheduled data, a maximum volume $N_{CB,max}$ of data that can be processed on a transmission carrier in the first transmission time of the current data. A calculation manner is $$N_{CB,max,lp} = \left\lfloor \frac{P_{max} \cdot S^{(i)} - C_{hp} \cdot N_{CB,hp}}{C_{lp} \cdot R_{LBRM}} \right\rfloor, \text{ and}$$

$$\left\lfloor \frac{P_{max} \cdot S^{(i)} - C_{hp} \cdot N_{CB,hp}}{C_{lp} \cdot R_{LBRM}} \right\rfloor$$

indicates that $$\frac{P_{max} \cdot S^{(i)} - C_{hp} \cdot N_{CB,hp}}{C_p \cdot R_{LBRM}}$$

is rounded down.

Step 3: $N_{CB,lp} \min(N, N_{ref}, N_{CB,max,lp})$.

N represents a size of an encoded code block.

Embodiment 9

A resource remained after high-priority scheduling is used for transmission of a low-priority service. If a code block size used for rate matching of a code block of a high-priority TB is $N_{CB,hp}$, $N_{CB,hp} = N_{CB,max}$ and a quantity of code blocks of the high-priority TB is $C_{hp}$, a resource remained after the code block of the high-priority TB uses a resource is $P_{max} \cdot S^{(i)} / R_{LBRM} - C_{hp} \cdot N_{CB,hp}$. Specifically:

Step 1: Calculate, based on a receiving capability of the receive end and a first transmission time of currently scheduled data, a maximum volume $N_{CB,max}$ of data that can be processed on a transmission carrier in the first transmission time of the current data. A calculation manner is $$N_{CB,max,lp} = \left\lfloor \frac{P_{max} \cdot S^{(i)} - C_{hp} \cdot N_{CB,hp}}{C_{lp} \cdot R_{LBRM}} \right\rfloor, \text{ and}$$

$$\left\lfloor \frac{P_{max} \cdot S^{(i)} - C_{hp} \cdot N_{CB,hp}}{C_{lp} \cdot R_{LBRM}} \right\rfloor$$

indicates that $$\frac{P_{max} \cdot S^{(i)} - C_{hp} \cdot N_{CB,hp}}{C_p \cdot R_{LBRM}}$$

is rounded down.

Step 2: $N_{CB,lp} = \min(N, N_{CB,max,lp})$.

In this application, the "carrier" may also be referred to as a "cell", and the "carrier" and the "cell" are equivalent in this application.

N represents a size of an encoded code block.

The foregoing describes in detail examples of the rate matching methods and the rate de-matching methods provided in the embodiments of this application. It may be understood that, to implement the foregoing functions, the transmit end and the receive end include corresponding hardware structures and/or software modules for implementing the functions. A person skilled in the art should be easily aware that, in combination with the examples described in the embodiments disclosed in this specification, units and algorithms steps can be implemented by hardware or a combination of hardware and computer software in this application. Whether a function is performed by hardware or hardware driven by computer software depends on particular applications and design constraints of the technical solutions. The person skilled in the art may use different methods to implement the described functions for each particular application, but it should not be considered that the implementation goes beyond the scope of this application.

FIG. 5 is a schematic structural diagram of a rate matching apparatus according to an embodiment of this application. The apparatus 500 includes:

a processing unit 510, configured to determine a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to transmit a first transport block to which a first code block belongs.

The processing unit 510 is further configured to determine $N_{CB}$ based on the receiving capability, where $N_{CB}$ represents a code block size used for rate matching.

The processing unit 510 is further configured to perform rate matching on the first code block based on $N_{CB}$.

Optionally, the processing unit 510 is specifically configured to:

determine the receiving capability of the receive end based on $P_{max}^{(i)}$ and $S^{(i)}$, where $P_{max}^{(i)}$ represents a maximum data rate on a carrier i, the carrier i is used to transmit the first transport block, $S^{(i)}$ represents duration of the first transmission time, and the receiving capability is positively correlated with both $P_{max}^{(i)}$ and $S^{(i)}$.

Optionally, the processing unit 510 is specifically configured to:

determine the receiving capability based on $TBS_{max}^{(i)}$ and $S^{(i)}$, where $TBS_{max}^{(i)}$ represents a maximum size of a transport block that can be transmitted on a carrier i in a second transmission time, $S^{(i)}$ represents duration of the first transmission time, the carrier i is used to transmit the first transport block, and the receiving capability is positively correlated with both $TBS_{max}^{(i)}$ and $S^{(i)}$.

Optionally, the processing unit 510 is specifically further configured to:

determine $N_{CB,max}$ based on the receiving capability, where $N_{CB,max}$ represents a maximum size of a single code block that can be processed by the receive end in the first transmission time, and $N_{CB,max}$ is positively correlated with the receiving capability; and determine $N_{CB}$ based on $N_{ref}$, N, and $N_{CB,max}$, where $N_{ref}$ represents a first reference code block size, N represents a size of the first code block, and $N_{CB}$ is a smallest value among $N_{CB,max}$, $N_{ref}$, and N.

Optionally, the processing unit 510 is specifically further configured to:

determine $N_{CB,max}$ based on $U^{(i)}$ and the receiving capability, where $N_{CB,max}$ is further positively correlated with $U^{(i)}$, $U^{(i)}$ represents a ratio of a transmission bandwidth of an active BWP of the carrier i to a sum of transmission bandwidths of active BWPs of all active receive carriers at the receive end, and the carrier i is used to transmit the first transport block.

Optionally, the processing unit 510 is specifically further configured to:

determine $N'_{ref}$ based on $TBS_{LBRM}$ and a maximum data transmission volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data transmission volume, and the maximum data transmission volume is positively correlated with $P_{max}^{(i)}$ and $S^{(i)}$, where $P_{max}^{(i)}$ represents the maximum data rate on the carrier i, and $S^{(i)}$ represents the duration of the first transmission time; and determine $N_{CB}$ based on N and $N'_{ref}$, where N represents a size of the first code block, and $N_{CB}$ is a smaller value between $N'_{ref}$ and N.

Optionally, the maximum data transmission volume is further positively correlated with $U^{(i)}$, and $U^{(i)}$ represents a ratio of a transmission bandwidth of an active BWP of the carrier i to a sum of transmission bandwidths of active BWPs of all active receive carriers at the receive end.

The apparatus 500 may further include other units, for example, a receiving unit and a sending unit. The receiving unit is configured to receive a notification message from the receive end, where the notification message is used to indicate that a size of data received by the receive end is beyond the receiving capability of the receive end. The sending unit is configured to: reduce, based on the notification message, a size of data to be sent per unit time.

Optionally, the notification message further includes a recommended transmission rate, and the recommended transmission rate is a data transmission rate that matches the receiving capability of the receive end.

Optionally, the notification message is physical layer signaling, higher layer signaling, or MAC layer signaling.

It should be understood that division into the foregoing units is merely function division, and may be other division in actual implementation. For example, the sending unit and the receiving unit are located in one communications module.

With reference to FIG. 12, the following describes another rate matching apparatus 1200 according to an embodiment of this application. The apparatus includes a processing unit 1210.

The processing unit 1210 is similar to the processing unit 510 in the rate matching apparatus 500 described above, and a difference lies in that optionally, the processing unit 1210 is further configured to:

determine $N_{CB}$ based on a receiving capability of a receive end, where $N_{CB,max}$ represents a maximum size of a single code block that can be processed by the receive end in a first transmission time, and $N_{CB,max}$ is positively correlated with the receiving capability of the receive end; and determine $N_{CB}$ based on N and $N_{CB,max}$ where N represents a size of a first code block, and $N_{CB}$ is a smaller value between $N_{CB,max}$ and N.

$N_{CB,max}$ is used to indicate data buffer volumes of the receive end in different cases. $N_{CB,max}$ represents a value obtained based on the receiving capability of the receive end in the first transmission time (the receiving capability of the receive end may be limited in the first transmission time). A transmit end uses a smallest value among $N_{ref}$, N, and $N_{CB,max}$ as a code block size ($N_{CB}$) used for rate matching, so that a volume of data actually transmitted on a channel is not beyond processing capability and/or buffer capability that are/is of the receive end. This can avoid insufficiency in processing capability and/or buffer overflow when the receiving capability of the receive end is limited. For example, if the receiving capability of the receive end is limited in the first transmission time, and a first transport block is excessively large, N is greater than $N_{CB,max}$. Then, the transmit end may use $N_{CB,max}$ as the code block size ($N_{CB}$) used for rate matching. For a method for calculating $N_{CB,max}$, refer to a calculation method in another embodiment below. In this case, $N_{ref}$ described in the apparatus 500 may not need to be obtained.

In addition, a specific implementation of the processing unit 510 is also applicable to the processing unit 1210. Details are not described again.

Other units that may be included in the apparatus 500 except the processing unit 510 and specific implementations of the other units are also applicable to the apparatus 1200. In addition, both a technical effect of the apparatus 500 and descriptions of related terms of the apparatus 500 are applicable to the apparatus 1200. Details are not described again.

FIG. 6 is a schematic structural diagram of a rate de-matching apparatus according to an embodiment of this application. The apparatus 600 includes a processing unit 610.

The processing unit 610 is configured to determine a receiving capability of a receive end, where the receiving capability is used to indicate a maximum data processing volume of the receive end in a first transmission time, and/or the receiving capability is used to indicate a maximum data buffer volume of the receive end in a first transmission time; and the first transmission time is used to receive a first transport block to which a first code block belongs.

The processing unit 610 is further configured to determine $N_{CB}$ based on the receiving capability, where $N_{CB}$ represents a code block size used for rate de-matching.

The processing unit 610 is further configured to perform rate de-matching on the first code block based on $N_{CB}$.

Optionally, the processing unit 610 is specifically configured to:
determine the receiving capability of the receive end based on $P_{max}^{(i)}$ and $S^{(i)}$, where $P_{max}^{(i)}$ represents a maximum data rate on a carrier i, the carrier i is used to transmit the first transport block, $S^{(i)}$ represents duration of the first transmission time, and the receiving capability is positively correlated with both $P_{max}^{(i)}$ and $S^{(i)}$.

Optionally, the processing unit 610 is specifically configured to:
determine the receiving capability based on $TBS_{max}^{(i)}$ and $S^{(i)}$, where $TBS_{max}^{(i)}$ represents a maximum size of a transport block that can be transmitted on a carrier i in a second transmission time, $S^{(i)}$ represents duration of the first transmission time, the carrier i is used to transmit the first transport block, and the receiving capability is positively correlated with both $TBS_{max}^{(i)}$ and $S^{(i)}$.

Optionally, the processing unit 610 is specifically further configured to:
determine $N_{CB,max}$ based on the receiving capability, where $N_{CB,max}$ represents a maximum size of a single code block that can be processed by the receive end in the first transmission time, and $N_{CB,max}$ is positively correlated with the receiving capability; and
determine $N_{CB}$ based on $N_{ref}$, N, and $N_{CB,max}$, where $N_{ref}$ represents a first reference code block size, N represents a size of the first code block, and $N_{CB}$ is a smallest value among $N_{CB,max}$, $N_{ref}$, and N.

Optionally, the processing unit 610 is specifically further configured to:
determine $N_{CB,max}$ based on $U^{(i)}$ and the receiving capability, where $N_{CB,max}$ is further positively correlated with $U^{(i)}$, $U^{(i)}$ represents a ratio of a transmission bandwidth of an active BWP of the carrier i to a sum of transmission bandwidths of active BWPs of all active receive carriers at the receive end, and the carrier i is used to transmit the first transport block.

Optionally, the processing unit 610 is specifically further configured to:
determine $N'_{ref}$ based on $TBS_{LBRM}$ and a maximum data transmission volume on the carrier i in the first transmission time, where $TBS_{LBRM}$ represents a reference transport block size, the carrier i is used to transmit the first transport block, $N'_{ref}$ represents a second reference code block size, $N'_{ref}$ is positively correlated with a smaller value between $TBS_{LBRM}$ and the maximum data transmission volume, and the maximum data transmission volume is positively correlated with $P_{max}^{(i)}$ and $S^{(i)}$, where $P_{max}^{(i)}$ represents the maximum data rate on the carrier i, and $S^{(i)}$ represents the duration of the first transmission time; and
determine $N_{CB}$ based on N and $N'_{ref}$, where N represents a size of the first code block, and $N_{CB}$ is a smaller value between $N'_{ref}$ and N.

Optionally, the maximum data transmission volume is further positively correlated with $U^{(i)}$, and $U^{(i)}$ represents a ratio of a transmission bandwidth of an active BWP of the carrier i to a sum of transmission bandwidths of active BWPs of all active receive carriers at the receive end.

The apparatus 600 may further include another unit, for example, a sending unit, configured to send a notification message to a transmit end, where the notification message is used to indicate that a size of data received by the receive end is beyond the receiving capability of the receive end.

Optionally, the notification message further includes a recommended transmission rate, and the recommended transmission rate is a data transmission rate that matches the receiving capability of the receive end.

Optionally, the notification message is physical layer signaling, higher layer signaling, or MAC layer signaling.

It should be understood that division into the foregoing units is merely function division, and may be other division in actual implementation.

It may be clearly understood by a person skilled in the art that, for detailed working processes of the foregoing apparatuses and units and technical effects generated by performing the steps, refer to descriptions in the foregoing corresponding method embodiments. For brevity, details are not described herein again.

The rate matching apparatus and the rate de-matching apparatus each may be a chip. The processing unit may be implemented by hardware or software. When the processing unit is implemented by hardware, the processing unit may be a logic circuit, an integrated circuit, or the like. When the processing unit is implemented by software, the processing unit may be a general-purpose processor, and is implemented by reading software code stored in a storage unit. The storage unit may be integrated into a processor, or may exist independently outside the processor.

With reference to FIG. 13, the following describes another rate de-matching apparatus 1300 according to an embodiment of this application. The apparatus includes a processing unit 1310.

The processing unit 1310 is similar to the processing unit 610 in the rate de-matching apparatus 600 described above, and a difference lies in that optionally, the processing unit 1310 is further configured to:

determine $N_{CB,max}$ based on a receiving capability of a receive end, where $N_{CB,max}$ represents a maximum size of a single code block that can be processed by the receive end in a first transmission time, and $N_{CB,max}$ is positively correlated with the receiving capability of the receive end; and determine $N_{CB}$ based on N and $N_{CB,max}$ where N represents a size of a first code block, and $N_{CB}$ is a smaller value between $N_{CB,max}$ and N.

$N_{CB,max}$ is used to indicate data buffer volumes of the receive end in different cases. $N_{CB,max}$ represents a value obtained based on the receiving capability of the receive end in the first transmission time (the receiving capability of the receive end may be limited in the first transmission time). A transmit end uses a smallest value among $N_{ref}$, N, and $N_{CB,max}$ as a code block size ($N_{CB}$) used for rate matching, so that a volume of data actually transmitted on a channel is not beyond processing capability and/or buffer capability that are/is of the receive end. This can avoid insufficiency in processing capability and/or buffer overflow when the receiving capability of the receive end is limited. For example, if the receiving capability of the receive end is limited in the first transmission time, and a first transport block is excessively large, N is greater than $N_{CB,max}$. Then, the transmit end may use $N_{CB,max}$ as the code block size ($N_{CB}$) used for rate matching. For a method for calculating $N_{CB,max}$, refer to a calculation method in another embodiment below. In this case, $N_{ref}$ described in the apparatus 600 may not need to be obtained.

In addition, a specific implementation of the processing unit 610 is also applicable to the processing unit 1310. Details are not described again.

Other units that may be included in the apparatus 600 except the processing unit 610 and specific implementations of the other units are also applicable to the apparatus 1300. In addition, both a technical effect of the apparatus 600 and descriptions of related terms of the apparatus 600 are applicable to the apparatus 1300. Details are not described again.

The following further describes the transmit end and the receive end provided in the embodiments of this application by using an example in which the transmit end is an access network device and the receive end is a terminal device.

FIG. 7 is a schematic structural diagram of a terminal device according to an embodiment of this application. The terminal device may be applied to the communications system shown in FIG. 1, to perform a function of the receive end in the foregoing method embodiments. For ease of description, FIG. 7 shows only main components of the terminal device. As shown in FIG. 7, the terminal device 70 includes a processor, a memory, a control circuit, an antenna, and an input/output apparatus. The processor is mainly configured to: process a communications protocol and communication data, control the entire terminal device, execute a software program, and process data of the software program. For example, the processor is configured to support the terminal device in performing actions described in the foregoing method embodiments, for example, determining the receiving capability of the receive end, determining $N_{CB}$ based on the receiving capability, and performing rate matching on the first code block based on $N_{CB}$. The memory is mainly configured to store the software program and the data, for example, store the first transport block and the first code block that are described in the foregoing embodiments. The control circuit is mainly configured to: perform conversion between a baseband signal and a radio frequency signal, and process the radio frequency signal. A combination of the control circuit and the antenna may be referred to as a transceiver, mainly configured to send and receive a radio frequency signal in an electromagnetic wave form. The input/output apparatus such as a touchscreen, a display screen, or a keyboard, is mainly configured to: receive data input by a user and output data to the user.

After the terminal device is powered on, the processor may read a software program in a storage unit, interpret and execute an instruction of the software program, and process data of the software program. When data needs to be sent in a wireless manner, after performing baseband processing on the to-be-sent data, the processor outputs a baseband signal to a radio frequency circuit. After performing radio frequency processing on the baseband signal, the radio frequency circuit sends a radio frequency signal through the antenna in a form of an electromagnetic wave. When data is sent to the terminal device, the radio frequency circuit receives a radio frequency signal through the antenna, converts the radio frequency signal into a baseband signal, and outputs the baseband signal to the processor. The processor converts the baseband signal into data, and processes the data.

A person skilled in the art may understand that, for ease of description, FIG. 7 shows only one memory and only one processor. An actual terminal device may have a plurality of processors and a plurality of memories. The memory may also be referred to as a storage medium, a storage device, or the like. This is not limited in this application.

In an optional implementation, the processor may include a baseband processor and/or a central processing unit. The baseband processor is mainly configured to process the communications protocol and the communication data. The central processing unit is mainly configured to: control the entire terminal device, execute the software program, and process the data of the software program. The processor in FIG. 7 may integrate functions of the baseband processor and the central processing unit. The person skilled in the art may understand that, the baseband processor and the central processing unit may be individually separate processors, and are interconnected by using a technology such as a bus. The person skilled in the art may understand that the terminal device may include a plurality of baseband processors to adapt to different network standards, the terminal device may include a plurality of central processing units to improve a processing capability of the terminal device, and the components of the terminal device may be connected through various buses. The baseband processor may also be expressed as a baseband processing circuit or a baseband processing chip. The central processing unit may also be expressed as a central processing circuit or a central processing chip. A function of processing the communications protocol and the communication data may be embedded into the processor, or may be stored in the storage unit in a form of a software program. The processor executes the software program to implement a baseband processing function.

In this embodiment of this application, the antenna and the control circuit that have sending and receiving functions may be considered as a transceiver unit 701 of the terminal device 70. For example, the transceiver unit 701 is configured to support the terminal device in performing a receiving function and a sending function described in the method 400. The processor having a processing function may be considered as a processing unit 702 of the terminal device 70. As shown in FIG. 7, the terminal device 70 includes the transceiver unit 701 and the processing unit 702. The transceiver unit may also be referred to as a transceiver, a transceiver, a transceiver apparatus, or the like. Optionally, a component that is in the transceiver unit 701 and that is configured to implement the receiving function may be considered as a receiving unit, and a component that is in the transceiver unit 701 and that is configured to implement the sending function may be considered as a sending unit. In other words, the transceiver unit 701 includes the receiving unit and the sending unit. The receiving unit may also be referred to as a receiver, an input port, a receiving circuit, or the like. The sending unit may be referred to as a transmitter, a transmitter, a transmitting circuit, or the like. For example, the transceiver unit 701 may not include the antenna, but include only the circuit, so that the antenna is disposed outside the transceiver unit.

The processor 702 may be configured to execute an instruction stored in the memory, to control the transceiver unit 701 to receive a signal and/or send a signal, and complete a function of the terminal device in the foregoing method embodiments. In an implementation, a function of the transceiver unit 701 may be implemented by using a transceiver circuit or a dedicated transceiver chip. When receiving and sending various types of signals, for example, receiving the first code block, the processor 702 controls the transceiver unit 701 to implement the receiving. Therefore, the processor 702 determines signal receiving and sending, and initiates data receiving and sending operations, and the transceiver unit 701 performs the signal receiving and sending.

Figure 8:
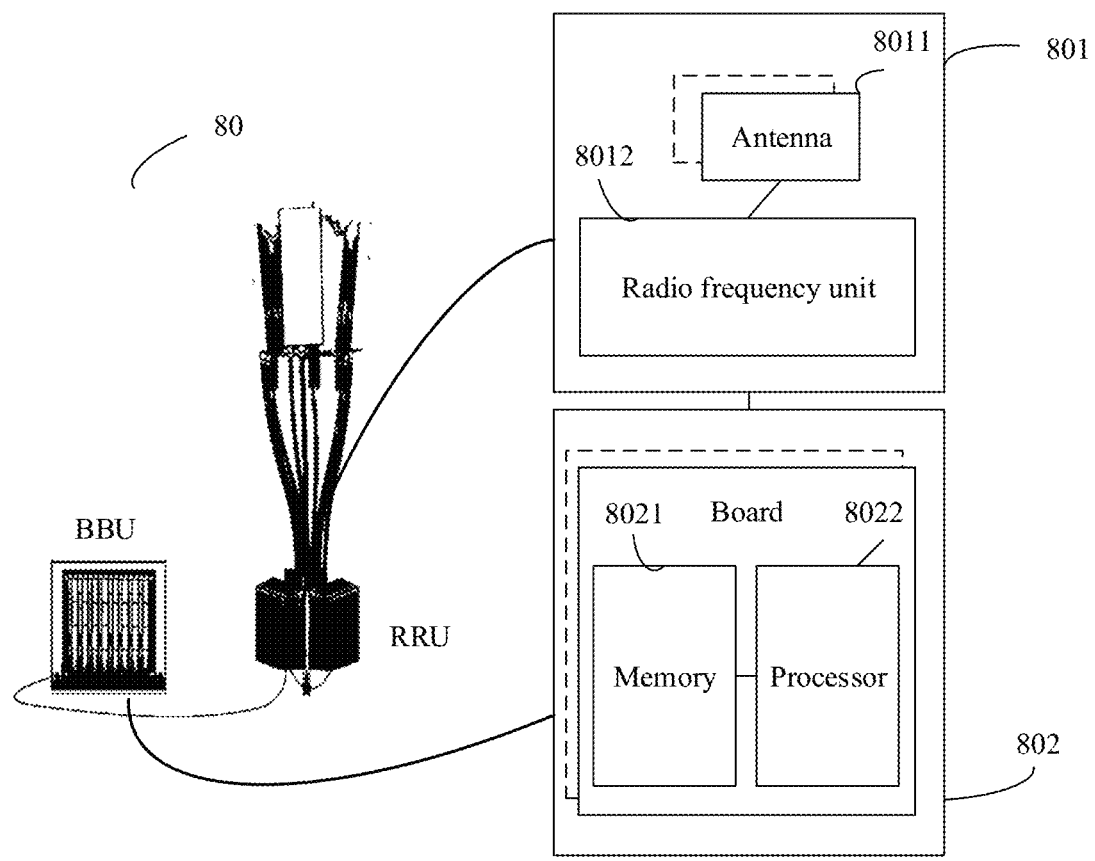
FIG. 8 is a schematic diagram of an access network device according to an embodiment of this application.

FIG. 8 is a schematic structural diagram of an access network device according to an embodiment of this application. The access network device may be, for example, a base station. As shown in FIG. 8, the base station may be applied to the communications system shown in FIG. 1, to perform a function of the transmit end in the foregoing method embodiments. The base station 80 may include one or more radio frequency units, such as a remote radio unit (RRU) 801 and one or more baseband units (BBU) (which may also be referred to as digital units (DU)) 802. The RRU 801 may be referred to as a transceiver unit, a transceiver, a transceiver circuit, a transceiver, or the like, and may include at least one antenna 8011 and a radio frequency unit 8012. The RRU 801 is mainly configured to: receive and send a radio frequency signal, and perform conversion between a radio frequency signal and a baseband signal. For example, the RRU 801 is configured to send the first code block in the foregoing method embodiments. The BBU 802 is mainly configured to: perform baseband processing, control the base station, and so on. The RRU 801 and the BBU 802 may be physically disposed together; or may be physically disposed separately, that is, the base station 80 is a distributed base station.

The BBU 802 is a control center of the base station, may also be referred to as a processing unit, and is mainly configured to implement a baseband processing function, for example, channel encoding, multiplexing, modulation, and spreading. For example, the BBU (the processing unit) 802 may be configured to control the base station to perform an operation procedure related to the network device in the method embodiments.

In an embodiment, the BBU 802 may include one or more boards. A plurality of boards may jointly support a radio access network (for example, a long term evolution (LTE) network) of a single access standard, or may separately support radio access networks (for example, an LTE network and a 5G network or another network) of different access standards. The BBU 802 further includes a memory 8021 and a processor 8022. The memory 8021 is configured to store a necessary instruction and necessary data. For example, the memory 8021 stores the first code block in the foregoing method embodiments. The processor 8022 is configured to control the base station to perform a necessary action. For example, the processor 8022 is configured to control the base station to perform the operation procedure related to the network device in the foregoing method embodiments. The memory 8021 and the processor 8022 may serve one or more boards. In other words, a memory and a processor may be disposed on each board. Alternatively, a plurality of boards may share a same memory and a same processor. In addition, a necessary circuit may further be disposed on each board.

FIG. 9 is a schematic structural diagram of a communications apparatus 900. The apparatus 900 may be configured to perform the steps of the method described in the foregoing method embodiments. For details, refer to the descriptions in the foregoing method embodiments. The communications apparatus 900 may be a chip, an access network device (such as a base station), a terminal device, another communications device, or the like.

The communications apparatus 900 includes one or more processors 901. The processor 901 may be a general purpose processor, a dedicated processor, or the like. For example, the processor 901 may be a baseband processor or a central processing unit. The baseband processor may be configured to process a communications protocol and communication data. The central processing unit may be configured to: control the communications apparatus (such as the base station, a terminal, or the chip), execute a software program, and process data of the software program. The communications apparatus may include a transceiver unit, configured to input (receive) and output (send) a signal. For example, the communications apparatus may be the chip, and the transceiver unit may be an input and/or output circuit or a communications interface of the chip. The chip may be used for the terminal, the base station, or the another communications device. For another example, the communications apparatus may be the terminal, the base station, or the another communications device, and the transceiver unit may be a transceiver, a radio frequency chip, or the like.

The communications apparatus 900 includes one or more processors 901, and the one or more processors 901 may implement a function of the execution device of the method in the embodiment shown in FIG. 3 and/or a function of the execution device of the method in the embodiment shown in FIG. 4.

In a possible design, the communications apparatus 900 includes a component configured to perform rate matching on the first code block, and a component configured to send the first code block. A function of the component for performing rate matching on the first code block may be implemented by using one or more processors, and the first code block may be sent through a transceiver, an input/output circuit, or an interface of a chip. For a method for performing rate matching on the first code block, refer to a related description in the foregoing method embodiments.

In another possible design, the communications apparatus 900 includes a component configured to perform rate de-matching on the first code block, and a component configured to receive the first code block. A function of the component for performing rate de-matching on the first code block may be implemented by using one or more processors, and the first code block may be received through a transceiver, an input/output circuit, or an interface of a chip. For a method for performing rate de-matching on the first code block, refer to a related description in the foregoing method embodiments.

Optionally, in addition to implementing a function in the embodiment shown in FIG. 3 and/or a function in the embodiment shown in FIG. 4, the processor 901 may further implement another function.

Optionally, in a design, the processor 901 may execute instructions, to enable the communications apparatus 900 to perform the steps described in the foregoing method embodiments. All or some of the instructions, for example, an instruction 903, may be stored in the processor. Alternatively, all or some of the instructions, for example, an instruction 904, may be stored in a memory 902 coupled to the processor. Alternatively, instructions 903 and 904 may be used together to enable the communications apparatus 900 to perform the steps described in the foregoing method embodiments.

In still another possible design, the communications apparatus 900 may alternatively include a circuit. The circuit may implement a function of the network device or the terminal device in the foregoing method embodiments.

In yet another possible design, the communications apparatus 900 may include one or more memories 902 that store an instruction 904. The instruction may be run on the processor, to enable the communications apparatus 900 to perform the method described in the foregoing method embodiments. Optionally, the memory may further store data. Optionally, the processor may also store an instruction and/or data. For example, the one or more memories 902 may store a correspondence described in the foregoing embodiments, or the related parameter or table provided in the foregoing embodiments. The processor and the memory may be separately disposed, or may be integrated together.

In still yet another possible design, the communications apparatus 900 may further include a transceiver unit 905 and an antenna 906. The processor 901 may also be referred to as a processing unit, and controls the communications apparatus (the terminal or the base station). The transceiver unit 905 may be referred to as a transceiver, a transceiver circuit, a transceiver or the like, and is configured to implement sending and receiving functions of the communications apparatus through the antenna 906.

This application further provides a communications system. The communications system includes the foregoing one or more access network devices and the foregoing one or more terminal devices.

It should be noted that, the processor in the embodiments of this application may be an integrated circuit chip, and has a signal processing capability. In an implementation process, the steps in the foregoing method embodiments can be implemented by using a hardware integrated logical circuit in the processor, or by using instructions in a form of software. The foregoing processor may be a general purpose processor, a digital signal processor (DSP), an application-specific integrated circuit (ASIC), a field programmable gate array (FPGA) or another programmable logical device, a discrete gate or transistor logic device, or a discrete hardware component. The processor may implement or perform the methods, steps, and logical block diagrams that are disclosed in the embodiments of this application. The general purpose processor may be a microprocessor, any conventional processor, or the like. Steps of the methods disclosed with reference to the embodiments of this application may be directly performed and completed by a hardware decoding processor or a combination of hardware in a decoding processor and a software module. The software module may be located in a mature storage medium in the art, such as a random access memory, a flash memory, a read-only memory, a programmable read-only memory, an electrically erasable programmable memory, or a register. The storage medium is located in the memory, and the processor reads information from the memory and completes the steps in the foregoing methods in combination with hardware of the processor.

It may be understood that the memory in the embodiments of this application may be a volatile memory or a nonvolatile memory, or may include both a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM) used as an external cache. As an example instead of a limitative description, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM). It should be noted that the memory in the system and methods described in this specification intends to include but is not limited to these memories and any other proper type of memory.

This application further provides a computer-readable medium, where the computer-readable medium stores a computer program, and when the computer program is executed by a computer, a function in any one of the foregoing method embodiments is implemented.

This application further provides a computer program product, and when the computer program product is executed by a computer, a function in any one of the foregoing method embodiments is implemented.

All or some of the foregoing embodiments may be implemented by software, hardware, firmware, or any combination thereof. When software is used to implement the embodiments, all or some of the embodiments may be implemented in a form of a computer program product. The computer program product includes one or more computer instructions. When the computer instructions are loaded and executed on a computer, the procedures or functions according to the embodiments of this application are all or partially generated. The computer may be a general purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a high-density digital video disc (DVD)), a semiconductor medium (for example, a solid-state drive (SSD)), or the like.

It should be understood that "an embodiment" mentioned in the entire specification means that particular characteristics, structures, or features related to the embodiment are included in at least one embodiment of this application. Therefore, the embodiments in the entire specification may not necessarily be a same embodiment. In addition, the particular characteristics, structures, or features may be combined in one or more embodiments in any appropriate manner. It should be understood that sequence numbers of the foregoing processes do not mean execution sequences in the embodiments of this application. The execution sequences of the processes should be determined based on functions and internal logic of the processes, and should not be construed as any limitation on the implementation processes of the embodiments of this application.

It should be further understood that, in this application, both "when" and "if" mean that UE or the base station performs corresponding processing in an objective case, but are not intended to limit time. In addition, "when" and "if" do not mean that the UE or the base station needs to perform a determining action during implementation, and do not mean that there is another limitation either.

In addition, the terms "system" and "network" may be used interchangeably in this specification. The term "and/or" in this specification describes only an association relationship between associated objects and indicates that three relationships may exist. For example, A and/or B may indicate the following three cases: Only A exists, both A and B exist, and only B exists.

It should be understood that in the embodiments of this application, "B corresponding to A" indicates that B is associated with A, and B may be determined based on A. However, it should be further understood that determining B based on A does not mean that B is determined based on A only. In other words, B may be further determined based on A and/or other information.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example based on functions. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

With descriptions of the foregoing implementations, the person skilled in the art may clearly understand that this application may be implemented by hardware, firmware, or a combination thereof. When this application is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any usable medium accessible to a computer. The following provides an example but does not impose a limitation: The computer-readable medium may include a RAM, a ROM, an EEPROM, a CD-ROM or another optical disc storage, a magnetic disk storage medium or another magnetic storage device, or any other medium that can carry or store expected program code in a form of an instruction or a data structure and can be accessed by a computer. In addition, any connection may be appropriately defined as a computer-readable medium. For example, if software is transmitted from a website, a server or another remote source through a coaxial cable, an optical fiber/cable, a twisted pair, or a DSL or by using wireless technologies such as infrared ray, radio, and microwave, the coaxial cable, optical fiber/cable, twisted pair, DSL or wireless technologies such as infrared ray, radio, and microwave are included in fixation of a medium to which they belong. For example, a disk and a disc used in this application include a compact disc (CD), a laser disc, an optical disc, a digital versatile disc (DVD), a floppy disk, and a Blu-ray disc. The disk generally copies data by a magnetic means, and the disc copies data by a laser means. The foregoing combination shall also fall within the protection scope of the computer-readable medium.

In conclusion, the foregoing descriptions are merely examples of embodiments of the technical solutions of this application, but are not intended to limit the protection scope of this application. Any modification, equivalent replacement, and improvement made without departing from the spirit and principle of this application shall fall within the protection scope of this application.

What is claimed is:

1. A rate matching method, comprising:
   determining a receiving capability of a receive end, wherein the receiving capability is used to indicate a maximum data processing volume of the receive end in a first transmission time, and the receiving capability is used to indicate a maximum data buffer volume of the receive end in a first transmission time, and the first transmission time is used to transmit a first transport block to which a first code block belongs;
   determining $N_{CB}$ based on the receiving capability, wherein $N_{CB}$ represents a code block size used for rate matching;
   performing rate matching on the first code block based on $N_{CB}$ and
   determining, based on the receiving capability, $N_{CB,max}$, based on $U^{(i)}$ and the receiving capability, wherein $N_{CB,max}$, is positively correlated with $U^{(i)}$, and wherein $N_{CB,max}$, represents a maximum size of a single code block that can be processed by the receive end in the first transmission time and, and wherein $N_{CB,max}$ is positively correlated with the receiving capability, wherein $U^{(i)}$ represents a ratio of a transmission bandwidth of an active bandwidth part (BWP) of the carrier i to a sum of transmission bandwidths of active BWPs of all active receive carriers at the receive end in the first transmission time, and wherein the carrier i is used to transmit the first transport block.

2. A rate de-matching method, comprising:
   determining a receiving capability of a receive end, wherein the receiving capability is used to indicate a maximum data processing volume of the receive end in a first transmission time, and the receiving capability is used to indicate a maximum data buffer volume of the receive end in a first transmission time, and the first transmission time is used to receive a first transport block;
   determining $N_{CB}$ based on the receiving capability, wherein $N_{CB}$ is a code block size used for rate de-matching;

performing rate de-matching on the first transport block based on $N_{CB}$ and determining, based on the receiving capability, $N_{CB,max}$, based on $U^{(i)}$ and the receiving capability, wherein $N_{CB,max}$ is postively correlated with $U^{(i)}$, and wherein $N_{CB,max}$ represents a maximum size of a single code block that can be processed by the receive end in the first transmission time and, and wherein $N_{CB,max}$ is positively correlated with the receiving capability, wherein $U^{(i)}$ represents a ratio of a transmission bandwidth of an active bandwidth part (BWP) of the carrier i to a sum of transmission bandwidths of active BWPs of all active receive carriers at the receive end in the first transmission time, and wherein the carrier i is used to transmit the first transport block.

3. The method according to claim 1, wherein the determining a receiving capability of a receive end comprises:

determining the receiving capability based on $P_{max}^{(i)}$ and $S^{(i)}$, wherein $P_{max}^{(i)}$ represents a maximum data rate on a carrier i, the carrier i is used to transmit the first transport block, $S^{(i)}$ represents a duration of the first transmission time, and the receiving capability is positively correlated with both $P_{max}^{(i)}$ and $S^{(i)}$.

4. The method according to claim 1, wherein the determining a receiving capability of a receive end comprises:

determining the receiving capability based on $TBS_{max}^{(i)}$ and $S^{(i)}$, wherein represents a maximum size of a transport block that can be transmitted on a carrier i in a second transmission time, $S^{(i)}$ represents duration of the first transmission time, the carrier i is used to transmit the first transport block, and the receiving capability is positively correlated with both $TBS_{max}^{(i)}$ and $S^{(i)}$.

5. The method according to claim 1, wherein the determining $N_{CB}$ based on the receiving capability comprises:

determining $N_{CB}$ based on $N_{ref}$, N, and $N_{CB,max}$, wherein $N_{ref}$ represents a first reference code block size, N represents a size of the first code block, and NCB is a smallest value among $N_{CB,max}$, $N_{ref}$ and N.

6. The method according to claim 1, wherein the determining NCB based on the receiving capability comprises:

determining $N_{CB,max}$ based on the receiving capability, wherein $N_{CB,max}$ represents a maximum size of a single code block that can be processed by the receive end in the first transmission time, and $N_{CB,max}$ is positively correlated with the receiving capability; and determining $N_{CB}$ based on N and $N_{CB,max}$, wherein N represents a size of the first code block, and $N_{CB}$ is a smaller value between $N_{CB,max}$ and N.

7. The method according to claim 1, wherein the determining $N_{CB}$ based on the receiving capability comprises:

determining $N_{ref}'$ based on $TBS_{LBRM}$ and the maximum data processing volume on the carrier i in the first transmission time, wherein $TBS_{LBRM}$ represents a reference transport block size, the carrier i is used to transmit the first transport block, $N_{ref}'$ represents a second reference code block size, $N_{ref}'$ is positively correlated with a smaller value between $TBS_{LBRM}$ and the maximum data processing volume, and the maximum data processing volume is positively p(i) P(') correlated with $P_{max}^{(i)}$ and $S^{(i)}$, wherein $P_{max}^{(i)}$ represents the maximum data rate on the carrier i, and $S^{(i)}$ represents the duration of the first transmission time; and determining $N_{CB}$ based on N and $N_{ref}'$, wherein N represents a size of the first code block, and $N_{CB}$ is a smaller value between $N_{ref}'$ and N.

8. The method according to claim 7, wherein the maximum data processing volume is further positively correlated with $U^{(i)}$, and $U^{(i)}$ represents a ratio of a transmission bandwidth of an active BWP of the carrier i to a sum of transmission bandwidths of active BWPs of all active receive carriers at the receive end.

9. A rate matching apparatus, comprising:

a processing unit, configured to determine a receiving capability of a receive end, wherein the receiving capability is used to indicate a maximum data processing volume of the receive end in a first transmission time, and the receiving capability is used to indicate a maximum data buffer volume of the receive end in a first transmission time, and the first transmission time is used to transmit a first transport block to which a first code block belongs, wherein the processing unit is further configured to determine $N_{CB}$ based on the receiving capability, wherein $N_{CB}$ represents a code block size used for rate matching;

the processing unit is further configured to perform rate matching on the first code block based on $N_{CB}$;

the processing unit is further configured to determining, based on the receiving capability, $N_{CB,max}$ based on $U^{(i)}$ and the receiving capability, wherein $N_{CB,max}$ is positively correlated with $U^{(i)}$, and wherein $N_{CB,max}$ represents a maximum size of a single code block that can be processed by the receive end in the first transmission time and, and wherein $N_{CB,max}$ is positively correlated with the receiving capability, wherein $U^{(i)}$ represents a ratio of a transmission bandwidth of an active bandwidth part (BWP) of the carrier i to a sum of transmission bandwidths of active BWPs of all active receive carriers at the receive end in the first transmission time, and wherein the carrier i is used to transmit the first transport block.

10. The apparatus according to claim 9, wherein the processing unit is specifically configured to:

determine the receiving capability based on $TBS_{max}^{(i)}$ and $S^{(i)}$, wherein $TBS_{max}^{(i)}$ represents a maximum data rate on a carrier i, the carrier i is used to transmit the first transport block, $S^{(i)}$ represents a duration of the first transmission time, and the receiving capability is positively correlated with both $P_{max}^{(i)}$ and $S^{(i)}$.

11. The apparatus according to claim 9, wherein the processing unit is specifically configured to:

determine the receiving capability based on $TBS_{max}^{(i)}$ and $S^{(i)}$, wherein $TBS_{max}^{(i)}$ represents a maximum size of a transport block that can be transmitted on a carrier i in a second transmission time, $S^{(i)}$ represents duration of the first transmission time, the carrier i is used to transmit the first transport block, and the receiving capability is positively correlated with both $TBS_{max}^{(i)}$ and $S^{(i)}$.

12. The apparatus according to claim 9, wherein the processing unit is further specifically configured to:

determine $N_{CB}$ based on $N_{ref}$, N, and $N_{CB,max}$ wherein $N_{ref}$ represents a first reference code block size, N represents a size of the first code block, and $N_{CB}$ is a smallest value among $N_{CB,max}$, $N_{ref}$ and N.

13. The apparatus according to claim 9, wherein the processing unit is further specifically configured to:

determine $N_{CB,max}$ based on the receiving capability, wherein $N_{CB,max}$ represents a maximum size of a single code block that can be processed by the receive end in the first transmission time, and $N_{CB,max}$ is positively correlated with the receiving capability; and determine $N_{CB}$ based on N and $N_{CB,max}$, wherein N represents a size of the first code block, and $N_{CB}$ is a smaller value between $N_{CB,max}$ and N.

14. The apparatus according to claim 9, wherein the processing unit is further specifically configured to:

determine $N_{ref}'$ based on $TBS_{LBRM}$ and the maximum data processing volume on the carrier i in the first transmission time, wherein $TBS_{LBRM}$ represents a reference transport block size, the carrier i is used to transmit the first transport block, $N_{ref}'$ represents a second reference code block size, $N_{ref}'$ is positively correlated with a smaller value between $TBS_{LBRM}$ and the maximum data processing volume, and the maximum data processing volume is positively correlated with $P_{max}^{(i)}$ and $S^{(i)}$, wherein $P_{max}^{(i)}$ represents the maximum data rate on the carrier i, and $S^{(i)}$ represents the duration of the first transmission time; and determine $N_{CB}$ based on N and $N_{ref}'$ wherein N represents a size of the first code block, and $N_{CB}$ is a smaller value between $N_{ref}'$ and N.

15. The apparatus according to claim 12, wherein the maximum data transmission volume is further positively correlated with $U^{(i)}$, and $U^{(i)}$ represents a ratio of a transmission bandwidth of an active BWP of the carrier i to a sum of transmission bandwidths of active BWPs of all active receive carriers at the receive end.

16. A non-transitory computer-readable medium storing computer instructions, that when executed by one or more processors, cause the one or more processors to enable a communications device to perform the method according to claim 1.

17. A communications apparatus, wherein the apparatus comprises a processor and a storage medium, the storage medium stores an instruction, and when the instruction is run by the processor, the processor is enabled to perform the method according to claim 1.

* * * * *